United States Patent
Scobey et al.

(10) Patent No.: US 6,798,553 B1
(45) Date of Patent: Sep. 28, 2004

(54) OPTICAL FILTER ELEMENTS AND METHODS OF MAKING AND USING SAME

(75) Inventors: Michael A. Scobey, Santa Rosa, CA (US); Lucien P. Ghislain, San Rafael, CA (US); Dennis J. Derickson, Windsor, CA (US); Loren F. Stokes, Santa Rosa, CA (US)

(73) Assignee: Bookham Technology plc, Santa Rosa, CA (US)

( * ) Notice: Subject to any disclaimer, the term of this patent is extended or adjusted under 35 U.S.C. 154(b) by 54 days.

(21) Appl. No.: 10/096,292

(22) Filed: Mar. 12, 2002

Related U.S. Application Data

(60) Provisional application No. 60/275,939, filed on Mar. 15, 2001, provisional application No. 60/276,022, filed on Mar. 15, 2001, provisional application No. 60/275,918, filed on Mar. 15, 2001, provisional application No. 60/276,018, filed on Mar. 15, 2001, provisional application No. 60/275,920, filed on Mar. 15, 2001, provisional application No. 60/275,998, filed on Mar. 15, 2001, provisional application No. 60/276,017, filed on Mar. 15, 2001, provisional application No. 60/276,019, filed on Mar. 15, 2001, provisional application No. 60/276,020, filed on Mar. 15, 2001, provisional application No. 60/276,023, filed on Mar. 15, 2001, provisional application No. 60/275,945, filed on Mar. 15, 2001, and provisional application No. 60/276,316, filed on Mar. 16, 2001.

(51) Int. Cl.[7] ............... G02F 1/03; G02B 6/12; G02B 6/26; G02B 6/28; H01S 3/08; G01B 9/02

(52) U.S. Cl. ............ 359/260; 385/14; 385/16; 385/24; 372/99; 356/454; 356/519

(58) Field of Search ................ 359/260, 248; 385/14, 16, 24; 372/18–21, 25, 26, 30, 32, 50, 92, 96, 98, 99, 102, 106; 257/21, 436; 356/519, 454, 345

(56) References Cited

U.S. PATENT DOCUMENTS

| | | | |
|---|---|---|---|
| 5,283,845 A | 2/1994 | Ip | |
| 5,982,488 A | 11/1999 | Shirasaki | |
| 6,125,220 A | 9/2000 | Copner et al. | |
| 2002/0054614 A1 * | 5/2002 | Jin | 372/20 |

* cited by examiner

Primary Examiner—Georgia Epps
Assistant Examiner—Jack Dinh
(74) Attorney, Agent, or Firm—Banner & Witcoff, LTD

(57) ABSTRACT

Optical filter elements and optical systems comprise optically mismatched etalons and optically mismatched stacked, optically coupled etalons that are directly optically coupled, at least one of the etalons or stacked, optically coupled etalons comprising first and second selectively transparent thin film mirror coatings on opposite surfaces of a bulk optic. The optically mismatched etalons can be configured to selectively pass single passbands. The disclosed optical systems optionally comprise other devices optically coupled to the optically mismatched etalons and optionally mismatched stacked, optically coupled etalons.

76 Claims, 21 Drawing Sheets

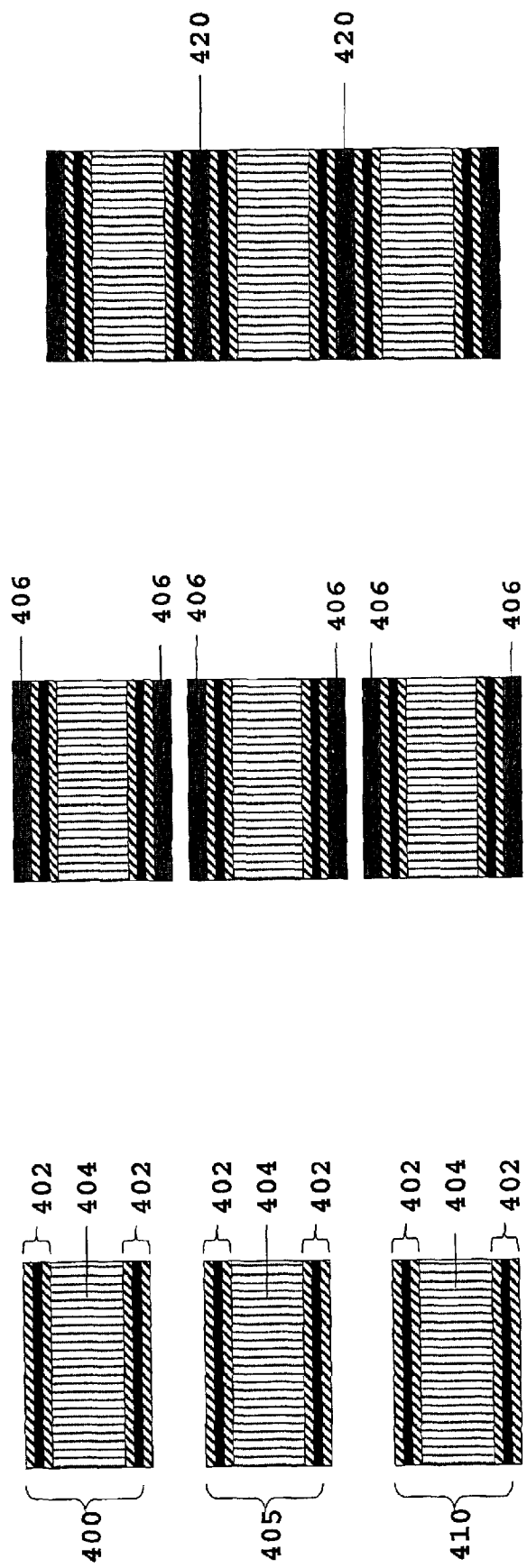

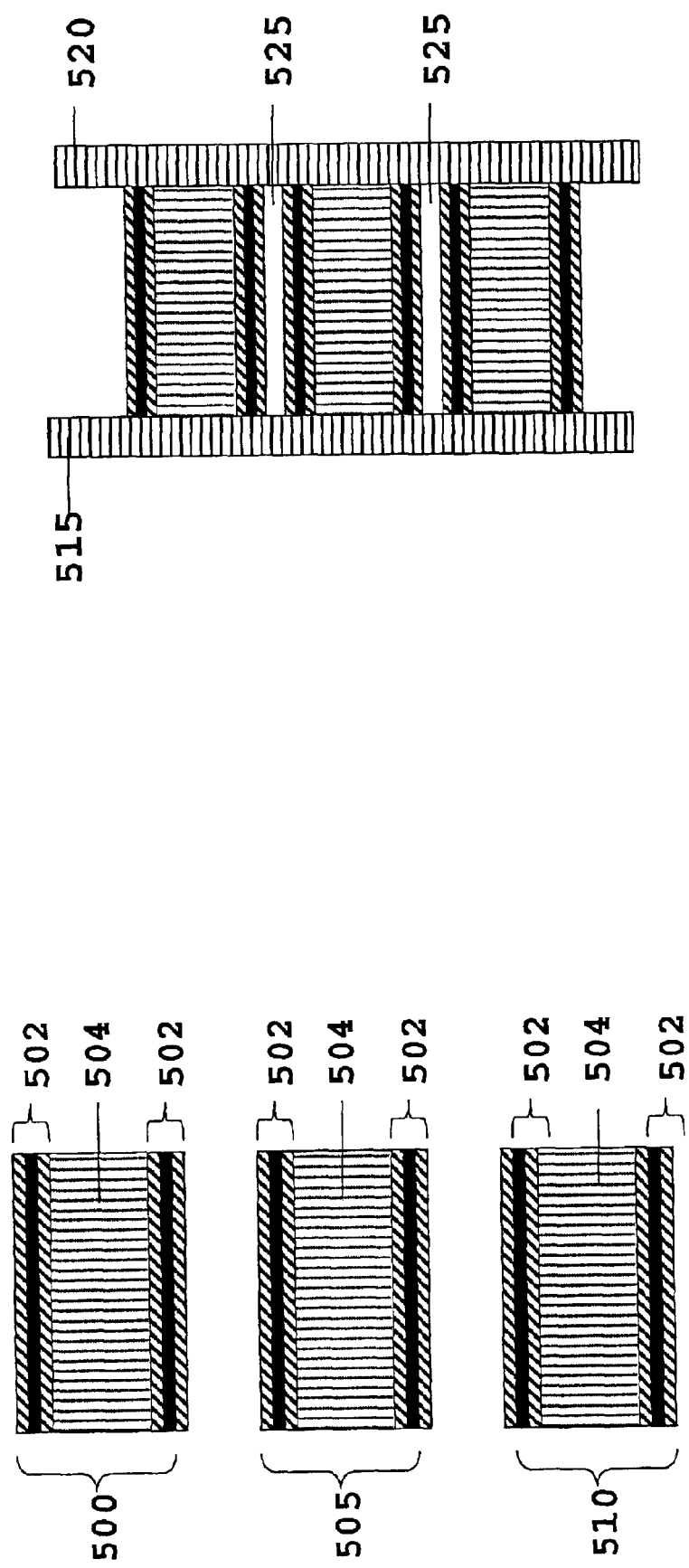

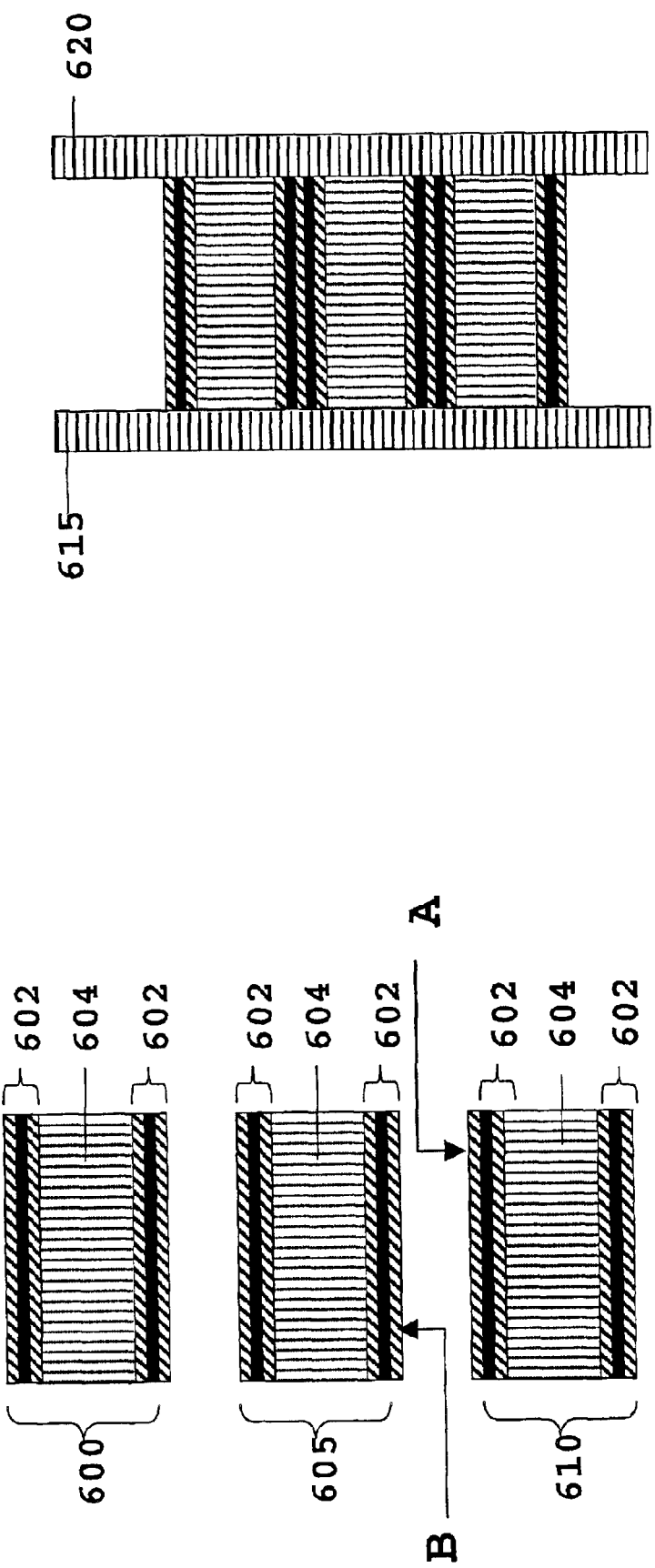

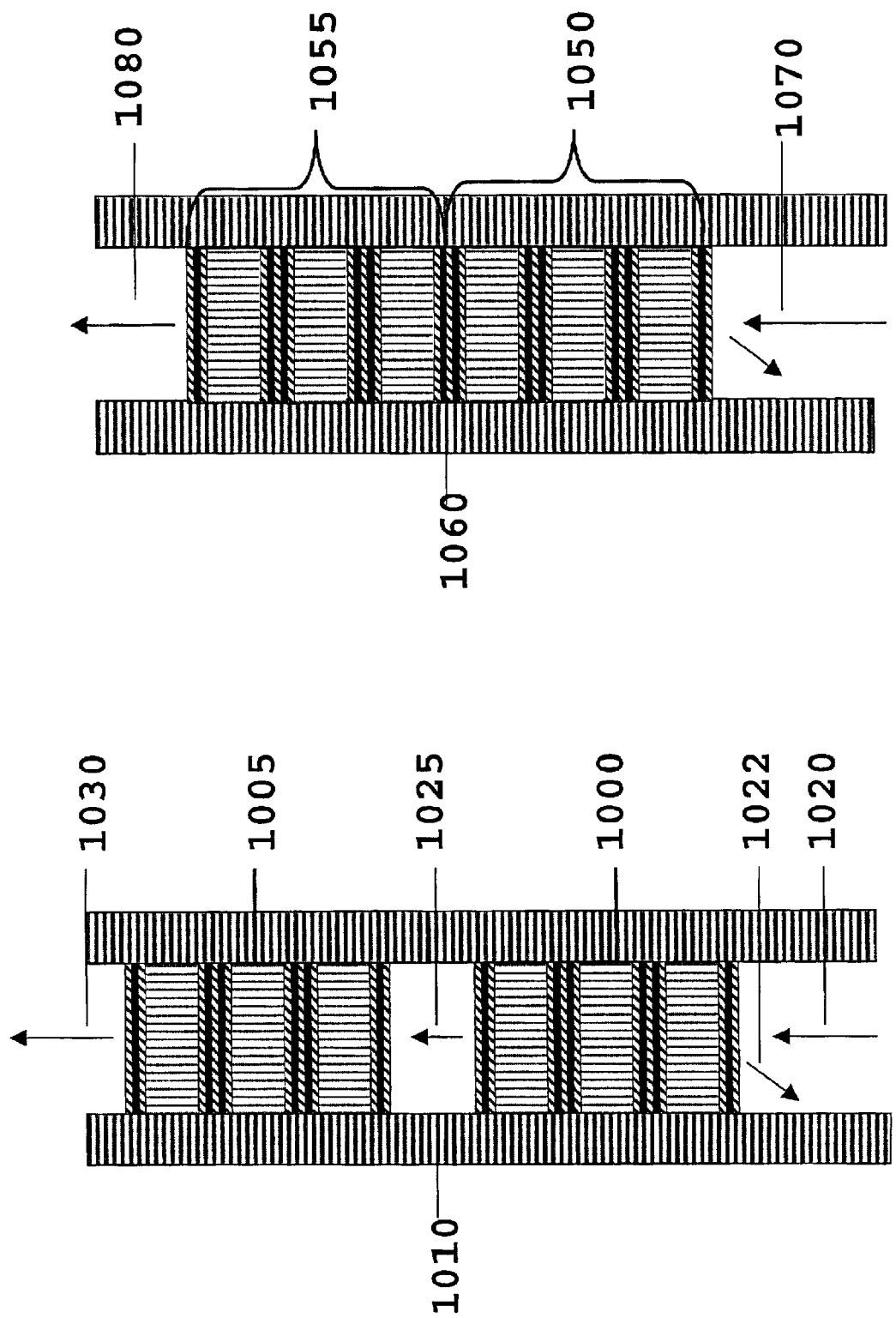

OPTICAL FILTER ELEMENTS AND METHODS OF MAKING AND USING SAME

PRIORITY APPLICATION

This application claim the benefit of U.S. Provisional Application No. 60/275,997 filed on Mar. 15, 2001 and titled "Optical Filter Elements and Methods of Making and Using Same."

CROSS-REFERENCED APPLICATIONS

This application is related to commonly assigned U.S. Provisional Application No. 60/275,939 filed on Mar. 15, 2001 and titled "Apparatus and Method for Vacuum Coating Deposition," U.S. Provisional Application No. 60/276,022 filed on Mar. 15, 2001 and titled "Optical System With 1×N Interleaver and Methods of Making and Using Same," U.S. Provisional Application No. 60/275,918 filed on Mar. 15, 2001 and titled "Optical System With Cascaded Interleavers and Methods of Making and Using Same," U.S. Provisional Application No. 60/276,018 filed on Mar. 15, 2001 and titled "Optically Coupled Etalons and Methods of Making and Using Same," U.S. Provisional Application No. 60/275,920 filed on Mar. 15, 2001 and titled "Iso-Optical Thermal Compensator and Methods of Making and Using Same," U.S. Provisional Application No. 60/275,998 filed on Mar. 15, 2001 and titled "Methods of Making Optical Etalons," U.S. Provisional Application No. 60/276,017 filed on Mar. 15, 2001 and titled "Optical System With Interleaver and Methods of Making and Using Same," U.S. Provisional Application No. 60/276,019 filed on Mar. 15, 2001 and titled "Optical Etalons and Methods of Making and Using Them," U.S. Provisional Application No. 60/276,020 filed on Mar. 15, 2001 and titled "Wafer Scale Production of Optical Elements," U.S. Provisional Application No. 60/276,013 filed on Mar. 15, 2001 and titled "Air Space Variable Optical Etalons and Methods of Making and Using Same," U.S. Provisional Application No. 60/275,945 filed on Mar. 15, 2001 and titled "Air Space Optical Etalons and Methods of Making and Using Same," and U.S. Provisional Application No. 60/276,316 filed on Mar. 16, 2001 and titled "Optical Monitoring of Thin Film Deposition Thickness," the entire disclosure of each of which is hereby incorporated herein by reference for all purposes.

INTRODUCTION

This invention relates to optically mismatched etalons and optically mismatched stacked, optically coupled etalons and to methods of making and using them, as well as to devices incorporating such optically mismatched etalons and optically mismatched stacked, optically coupled etalons.

BACKGROUND

Etalons are ubiquitous in optical systems, such as optical sensors, optical communication systems, etc. The basic Fabry-Perot etalon can be designed and produced to have a sharp response at resonant frequencies, which makes them suitable as optical filters such as bandpass filters. They also give a variable amount of dispersion, and so have been suggested for possible use as dispersion compensators. Thus Fabry-Perot etalons are a basic building block in a number of different optical elements, i.e., in optically functional components or devices. Such devices may be active or passive and may be employed in a system (or adapted to be employed in a system) to pass or transmit a selective wavelength or band of wavelengths or periodic set of wavelength bands. Exemplary optical elements in which etalons are used include optical sensors, and filters, e.g., band pass filters, single channel filters, and other wavelength selective filter devices such as wavelength division multiplexers, and dispersion compensators and other components of optical communication systems.

Etalons typically comprise precisely parallel selectively transmissive surfaces such as thin films, i.e., partially reflective mirrors or surfaces on opposite sides of an integral number of half waves distance or gap between them, forming the etalon's cavity. The thin film and cavity characteristics determine the optical properties of the etalon. That is, the spectral characteristics of the etalon are generally determined by the reflectivity of the mirrors or surfaces and by the optical thickness of the cavity length. Such etalons have long been produced, for example, by sputter deposition of film stacks of alternating layers of materials, i.e. a high refractive index material alternating with a low refractive index material, to form a mirror coating, which is transmissive of selected wavelengths. Two such mirror coatings sandwich a sputter-deposited cavity layer between them. Sputtering or other physical vapor deposition of the relatively thick cavity layer is time consuming and, therefore adds substantial time and cost to the production of such etalons. The result is undesirably high cost for production for such etalons.

It has long been a recognized problem in this industry, that producing etalons having desired properties can be difficult and expensive. In addition, there are industry-recognized problems associated with producing structurally robust etalons having desired, precise optical properties. Prior known etalons have employed various designs, such as the etalons used in the interferometric optical devices of U.S. Pat. No. 6,125,220 to Copner et al. In the interleaver/de-interleaver devices of Copner et al, two glass interferometric end plates are separated by a spacer region where the etalon is formed. The spacer region is an air gap having a predetermined dimension. In adjustable Fabry-Perot devices, such as those disclosed in U.S. Pat. No. 5,283,845 to Ip, tuning of the center wavelength of the spectral passband of an etalon is achieved by varying the effective cavity length (spacing) between two end plates carrying thin film reflectors. More specifically, in Ip a piezo actuator is used, extending between the two end plates. By varying the electric power applied to the piezo actuator, the axial length of the actuator can be varied, and thus the gap between the end plates varied. As alternatives to piezo-electric actuators, the tuning mechanism may include liquid crystals, temperature, pressure, and other mechanisms. It is a disadvantage that adjustable etalons as in Ip involve considerable assembly complexity and cost. Also, maintaining strict parallelism between the end plates can present additional difficulties.

The prior known optical etalons, as noted above, fail to fully meets the needs of many applications, especially for optical elements intended for optical communication systems, precision sensors, etc.

It is an object of the present invention to provide optical filter elements comprising optically mismatched etalons and optically mismatched stacked, optically coupled etalons addressing some of the deficiencies of the prior known technologies. It is a particular object of at least certain preferred embodiments, to provide optically mismatched and directly optically coupled etalons and optically mismatched and directly optically coupled and stacked, optically coupled etalons and methods of making same, and optical systems incorporating such optically mismatched etalons and optically mismatched stacked, optically coupled etalons. Additional objects and aspects of the invention and of certain preferred embodiments of the invention will be apparent from the following disclosure and detailed description.

SUMMARY

In accordance with a first aspect, an optical filter element is provided for filtering multiplexed light, comprising multiple directly optically coupled etalons, at least a first and a second of the etalons having optically mismatched periodic passbands, as more fully described below. In accordance with another aspect an optical system comprises a source of light, preferably multiplexed light, and an optical filter element as just described. Multiplexed light, as used here, is light having multiple channels, for example 1–n channels where n is the total number of channels. In preferred embodiments, an optical filter element comprises at least first and second Fabry-Perot etalons, preferably a plurality of Fabry-Perot etalons, that are optically mismatched, e.g. have optically mismatched periodic passbands, and that are directly optically coupled. As used here, optically mismatched, optical mismatching, or optically mismatching occurs when etalons having a different passband response are placed into an optical element. As used here, optically mismatched periodic passbands will be understood by those skilled in the art, given the benefit of this disclosure, to be mismatched sufficiently such that only one the passbands of a first etalon (or of the first etalon stack, as the case may be) overlaps any passband of the second etalon (or of a second etalon stack, as the case may be) within the wavelength range of interest. In a typical optical filter element disclosed here, the passbands of the first and second etalons may have a wavelength width approximately equal to the width of a single channel of multichannel multiplexed light. For example, in a telecommunication system operating in the C-band (approx 1530 nm to 1570 nm), wherein the C-band is divided into 40 channels, the channels each would be about 0.8 nm, and the passbands for each channel typically would be about 0.4 nm and centered in the allotted 0.8 nm channel. The period of the two etalons would, of course, as disclosed above, be sufficiently different that they overlap each other only once in the C-band. As used here, passbands overlap if they have approximately the same center wavelength and/or together pass sufficient light or signal strength for the common passband to be operative as a channel of the multichannel system in which the optical filter element is employed. Therefore, the optical filter element can act to filter out all passbands except the overlapping passband. Optical components, such as etalons and stacked, optically coupled etalons, can be directly optically coupled, as the term is used here, when they are optically coupled, i.e. are in the same optical path, and furthermore are in optical contact or are otherwise in physical contact with each other and/or mounted to each other (e.g. by bonding material in or out of the optical path) or mounted together in the same housing or by the same fixture. An air space may be separating the etalons, or the stacked, optically coupled etalons, or the etalons, or stacked, optically coupled etalons, may be in direct surface-to-surface contact. Similarly, optical components in an optical system comprising the etalons, or stacked, optically coupled etalons, disclosed here, that are directly optically coupled in accordance with the present disclosure, preferably have no intervening optical components performing substantial channel filtering or like optical operations on any passed signals. In particular, any signals passed by the etalons, or stacked, optically coupled etalons, or other optical components in the optical system, arrive at a second etalon, or second stacked, optically coupled etalons, or other optical component, without any intervening wavelength filtering optical operations to add or drop passbands or like operations. One skilled in the art, given the benefit of this disclosure, will be able to design and assemble optical systems comprising directly optically coupled etalons, directly optically coupled and stacked, optically coupled etalons, and other optical components described here.

In accordance with another aspect, an optical filter element, suitable for use in an optical system, comprises stacked optically coupled etalons, wherein the etalons of the stack have different passband responses. Each of the etalons, of the stacked, optically coupled etalons, may be placed in optical contact, i.e. the thin film coatings of a first etalon in direct and substantially continuous surface-to-surface contact with the thin film coatings of an adjacent etalon in the stack, or may be placed in contact using one or more bonding layers optically coupled with each other between adjacent etalons. As used herein, a bonding layer is any layer of bonding material on a surface of an etalon and used to physically attach that etalon to an adjacent etalon. The bonding layer optionally is in the light path through the stacked etalon and serves also to optically couple the adjacent etalon. In such embodiments, preferably the thickness of the bonding layer is equal to an odd number of quarter wavelength optical thickness (QWOTs). This bonding layer may comprise an adhesive, such as an epoxy, e.g. the epoxies available from Epoxy Technology, Billerica, Mass., such as EPO-TEK 353 ND, an adhesive optionally having a monolayer of small beads embedded in the adhesive to facilitate precise spacing of the adjacent etalons, fritted glass or any other composition or material that may be deposited to an odd number of QWOTs and is capable of bonding the etalons together. The stacked, optically coupled and optically mismatched etalons can be housed within an optical system. Preferably, the first etalon in the stacked, optically coupled and optically mismatched etalons is selectively transparent to only certain passbands. The second etalon in the stacked, optically coupled and optically mismatched etalons is also selectively transparent to only certain passbands, and the passband response of the second etalon differs from the passband response of the first etalon. In accordance with preferred embodiments, only a single passband of the first and second etalons overlap. Therefore, stacked, optically coupled etalons comprising optically mismatched etalons can be used as an optical filter to select only a single passband.

In accordance with additional aspects, an optical filter element, suitable for use in an optical system, comprises at least a first etalon optically coupled and optically mismatched with at least first stacked, optically coupled etalons. Preferably the first etalon comprises selectively transparent thin film coatings that act to pass only certain passbands. Preferably the first stacked, optically coupled etalons also selectively pass only certain passbands, and the passband of the first stacked etalons only overlaps the passband of the first etalon at a single passband. The first etalon and first stacked, optically coupled etalons can be housed within an optical system, and the first etalon and first stacked, optically coupled etalons may be separated by air space or may be in direct contact. Directly optically coupling the first etalon and first stacked, optically coupled etalons can result in the filtering of all passbands of multiplexed light except for the one overlapping passband of the etalon and stacked, optically coupled etalons. Therefore, optically mismatching of an etalon and stacked, optically coupled etalons can be used as an optical filter to select only a single passband.

In accordance with another aspect, an optical filter element, suitable for use in an optical system, comprises at least first and second stacked, optically coupled Fabry-Perot etalons that are optically mismatched. In accordance with preferred embodiments, each stack of etalons comprises optically matched etalons. However, different stacked, optically coupled etalons may be optically mismatched to select a passband from multiplexed light. Each of the etalons, of the stacked, optically coupled etalons, may be placed in optical contact, i.e. the thin film coatings of a first etalon in direct and substantially continuous surface-to-surface contact with the thin film coatings of an adjacent etalon in the stack, or may be placed in contact using one or more bonding layers optically coupled with each other between adjacent etalons. The first and second stacked optically coupled etalons may be separated by air space or may be in direct contact. The first and second stacked, optically coupled etalons can be housed within an optical system. In accordance with preferred embodiments, the first stacked, optically coupled etalons are selectively transparent to only certain passbands, and the second stacked, optically coupled etalons are also selectively transparent to only certain passbands, preferably different passbands except for one overlapping passband. That is, the passbands of the first and second stacked, optically coupled etalons overlap at only a single passband. Directly optically coupling the first and second stacked, optically coupled etalons can result in the filtering of all passbands of multiplexed light except for the one overlapping passband. Therefore, optically mismatching stacked, optically coupled etalons can be used as an optical filter to select only a single passband.

In accordance with another aspect, one or more of the etalons, or one or more of the etalons of the stacked, optically coupled etalons, preferably each etalon, comprises a bulk optic having first and second parallel, selectively transparent surfaces. The bulk optic comprises a solid optically transparent body (at the wavelengths of interest) and optionally comprises a wedge correcting coating (referred to here generally as a "wedge coating") and/or a thickness-adjustment layer on at least one of the two surfaces of the optically transparent body. The wedge coating, further described below, establishes high precision parallelism of the selectively transparent surfaces of the etalon. The thickness of the bulk optic (including any wedge coating), i.e., the dimension between the selectively transparent, parallel surfaces, defines the cavity spacing. Preferably, the bulk optic, including the wedge coating, will typically have an optical thickness equal to an integral number of half waves for the wavelength of interest. In preferred embodiments the selectively transparent surfaces are thin film mirror coatings comprising, for example, a film stack of alternating high and low refractive index oxides or a metal thin film in accordance with known thin film technologies. One skilled in the art, given the benefit of this disclosure, will be able to construct optically mismatched etalons and stacked, optically coupled etalons by, for example, varying the thickness of the bulk optic, varying the materials of the bulk optic, varying the properties and compositions of the thin films, etc.

If a wedge coating is used, the thickness of the wedge coating varies progressively across the etalon. That is, the thickness of the wedge coating, viewed in cross-section in at least one plane orthogonal to the parallel, selectively transparent surfaces of the etalon, has a thickness that increases (or decreases in the opposite direction) continuously, typically approximately linearly, to compensate for non-parallelism, or "wedge", in the underlying body of the bulk optic. As described further below, the bulk optic can be diced from a wafer on which a wedge coating and the two thin film coatings have been deposited by magnetron sputtering, ion beam sputtering or other known deposition techniques. Preferably, surface polishing is performed to first polish the wafer, for example, a silica wafer suitable for optical filter production, to parallelism within 1 to 2 arc seconds and wavefront error of less than $\frac{1}{50}$ (2.0%) of a wave at the wavelength of interest. For an etalon intended for use as one of multiple stacked etalons in an optical element in an optical telecommunication system, the wavefront error will preferably be less than $\frac{1}{50}$ of a wave at 1550 nm. Low wavefront error can be understood in this context to mean that the thickness of the bulk optic, i.e., the distance between the two opposite surfaces of the bulk optic, is substantially linearly variable and, hence, controllable or correctable by a wedge coating in accordance with the present disclosure.

In accordance with preferred embodiments, the wedge coating is deposited onto the optically transparent body of the bulk optic by physical vapor deposition, i.e magnetron sputtering or ion beam sputtering in a vacuum chamber, with the bulk optic (alone or as part of a larger substrate, such as a typical 6 inch or larger substrate wafer used in the production of optical filters) not spinning during deposition. Preferably the coating is a low defect coating to allow optical contact bonding or other optical coupling of the stacked etalons. Deposition can be otherwise in accordance with known techniques, whose applicability and manner of implementation will be within the ability of those skilled in the art given the benefit of this disclosure. The substrate is oriented at an angle to the target or otherwise arranged to receive progressively different deposition rates from one edge to the opposite edge. The target is preferably an elongate source to provide a coating with a roughly linear profile. Preferably, the target is tangential to the circumference of the substrate and is about four times as large as the substrate, e.g. for a 6 inch diameter substrate the target can be about 20 inches long. The thinnest point of the substrate is positioned closest to the target or otherwise oriented or favored to have the fastest rate of deposition. Conversely, the thickest point is positioned or oriented to have the lowest deposition rate. Thus, the sputtered material will deposit fastest and, therefore, the most heavily, i.e., the thickest, where the bulk optic was thinnest, with progressively thinner deposition toward the area where the least was wanted. Since the substrate is not spinning and is oriented or arranged as just described, the thickness of the resulting wedge coating will change progressively (hence the term "wedge"), with the change in the thickness of the wedge coating being opposite that of the underlying body. The net effect is that the thickness of the bulk optic is substantially uniform over all or a large portion of its area. Where the bulk optic is prepared in the form of a typical substrate wafer, thin films can then be deposited to complete the etalon (subject to any further production or packaging steps etc.) in the same or a different sputter deposition chamber. Deposition of a wedge coating and thin films on another, second surface of the bulk optic may be performed in accordance with the embodiments described here.

In accordance with another aspect, one or more of the etalons contained within stacked, optically coupled etalons, most preferably all of the stacked etalons, each comprises a thickness-adjustment layer of substantially uniform thickness on at least one of the two surfaces of the optically transparent body. As used herein, substantially uniform thickness means the thickness of the layer across the surface of the bulk optic is approximately constant. The thickness-adjustment layer, further described below, establishes the desired thickness of the bulk optic cavity of the etalon. One skilled in the art, given the benefit of this disclosure, will recognize that the thickness of the thickness adjustment layer may be varied to achieve etalons having different passband responses suitable for optical mismatching. The bulk optic is a solid, optically transparent (at the wavelengths of interest) body whose thickness, i.e. the dimension between the selectively transparent, parallel surfaces, including the thickness-adjustment layer, defines the cavity spacing. In particular, the bulk optic, including the thickness-adjustment layer, will typically have an optical thickness equal to an even numbers of QWOTs at the same or all points for the wavelength(s) of interest. In preferred embodiments, the selectively transparent surfaces are Fabry-Perot thin film coatings comprising, for example, a film stack of alternating high and low refractive index oxides or a metal thin film in accordance with known thin film technologies. Preferably, the thin film coatings comprise a continuous uniform thickness metal film. As described further below, the bulk optic can be diced from a wafer on which a thickness-adjustment layer and the two Fabry-Perot thin film coatings have been deposited by magnetron sputtering, ion beam sputtering, or other known deposition techniques. Preferably, surface polishing is performed to first polish the wafer, for example, a silica wafer suitable for optical filter production, to parallelism within 1 to 2 arc seconds and wavefront error of less than $1/50$ (2.0%) of a wave at the wavelength of interest.

In accordance with certain embodiments as disclosed above, the stacked, optically coupled etalons, suitable for use in the optically mismatched stacked, optically coupled etalons, may be bonded to each other. Each etalon comprises any or all of the components listed above including, but not limited to, a bulk optic, optionally comprising a wedge coating and/or a thickness-adjustment layer, and thin film mirror coatings on the surfaces of the bulk optic. Between adjacent etalons may be a layer of bonding material that acts to optically couple the etalons together. The thickness of the bonding layer is preferably equal to an odd number of QWOTs. This bonding layer may be an adhesive, such as an epoxy (i.e. EPO-TEK 353ND from Epoxy Technology, Inc. in Billerica, Mass.), an adhesive optionally having a monolayer of small beads embedded in the adhesive to facilitate precise spacing of the adjacent etalons, fritted glass or any other composition or material that may be deposited to an odd number of QWOTs and is capable of bonding the etalons together. One skilled in the art will recognize, given the benefit of this disclosure, that the bonding material described here may be used to directly optically couple the etalons and stacked, optically coupled etalons.

In accordance with certain preferred embodiments, the etalons of the stacked, optically coupled etalons are joined by depositing an optically transparent fritted glass layer on a surface of etalons. The fritted glass is preferably deposited using a vapor deposition process to a controlled thickness. The fritted glass layer may be deposited onto substrate wafers as disclosed above or onto individual etalons. Two or more wafers can be stacked or, alternatively, individual coupons or individual etalons can be stacked after being coated with fritted glass. After being placed in physical contact, the etalons are heated to the melting or softening point of the fritted glass, bonding the stacked etalons together. Preferably, after the etalons are joined, the thickness of the fritted glass layer between them is equal to an odd number of QWOTs. One skilled in the art will recognize, given the benefit of this disclosure, that this process may be repeated using additional etalons to increase the number of etalons that are joined and stacked.

In accordance with certain preferred embodiments, the etalons are joined using "feet." As used herein, "feet" are projections from opposite surfaces of adjacent etalons. "Feet" can be formed of fritted glass or other suitable materials able to provide, a structurally stable stacking of the adjacent etalons to each other. After adjacent etalons are positioned in contact, heat can be applied to sufficiently melt or soften the "feet" so as to join the etalons to each other. Preferably, after joining the etalons, the distance between the etalon surfaces is equal to an odd number of QWOTs.

In accordance with certain preferred embodiments, adjacent etalons are joined using a layer of epoxy or other suitable adhesive. The adhesive can be applied using any suitable technique. The adhesive may be deposited onto wafers, coupons, or onto individual etalons. Two or more wafers, two or more coupons, or individual etalons are stacked in physical contact after the adhesive is applied. After being placed in physical contact, the adhesive layer bonds the etalons forming stacked, optically coupled etalons. Preferably, after the etalons are joined, the thickness of the epoxy layer is equal to an odd number of QWOTs. One skilled in the art will recognize, given the benefit of this disclosure, that this process may be repeated using additional etalons to increase the number of etalons that are coupled and stacked. In accordance with certain preferred embodiments, the etalons are joined using adhesive comprising optically transparent beads sized to function as a monolayer to assure a controlled spacing between the etalons. The small bead/adhesive mixture may be deposited onto wafers, coupons or onto individual etalons. One or more wafers, coupons, or etalons are placed in physical contact after being coated with the bead/adhesive mixture. After being placed in physical contact, the bead/adhesive mixture bonds the etalons forming stacked, optically coupled etalons having a uniform separation. Preferably, after the etalons are joined together, the thickness of the bead/adhesive layer is equal to an odd number of QWOTs. One skilled in the art will recognize, given the benefit of this disclosure, that this process may be repeated using additional etalons to increase the number of etalons that are coupled and stacked.

In accordance with preferred embodiments, the etalons may be coupled together and/or optically mismatched using optical contact. To accomplish optical contact bonding, adjacent etalons are placed in physical contact with each other. Etalons are prepared as described above. The etalons are then placed into physical contact and, while not wishing to be bound by theory, it is presently understood that adjacent etalons in optical contact with each other are held together by electrostatic forces between the contacting surfaces of the etalons. For certain preferred embodiments, the selectively transparent thin film mirror coatings of the stacked etalons are formed of alternating films of high refractive index material and low refractive index material. Preferably, the outermost film of the mirror coating of one etalon is the same (i.e., either low or more preferably high refractive index) as the outermost film of the mirror coating of the adjacent etalon. The spacer or transition layer between them preferably has the opposite refractive index. Thus, if the two outermost films facing each other are high refractive index, then an air spacer or other low refractive index material preferably fills the odd QWOT space between the two etalons. Likewise, if the mirror coatings finish with low refractive index materials, then the joining transition layer between the two etalons should have a high refractive index. Alternatively, the thickness of the outermost layer of the thin films may be reduced such that, when combined together they form a joining transition layer of refractive index opposite to that of the next film on either side. In other preferred embodiments, the etalons may be held in a stacked position using a coupling member such as a metal jacket, sleeve, etc. Should a coupling member be used, any space that exists between the etalon surfaces is preferably equal to an odd number of QWOTs and may be filled with air or other suitable material.

In accordance with another aspect, additional cavities can be deposited on either surface of the bulk optic etalons by suitable deposition techniques, such as, for example, ion beam sputtering, magnetron sputtering, etc. That is, additional cavities can be formed on a bulk optic etalon. More specifically, following deposition of a suitable transition layer overlying the thin film stacks on either surface of the bulk optic etalon, a cavity can be deposited by, for example, sputtering a first suitable thin film coating or stack, such as a sequence of alternating H/L/H film, followed by deposition of a cavity film, followed by deposition of a second thin film coating or stack which preferably is substantially identical to the first thin film coating. Similarly, yet one or more such thin film etalons can be deposited thereafter employing suitable odd QWOT transition layers between, in accordance with thin film principles well known to those skilled in the art. Thus, the advantage of improved optical performance characteristics of a multi-cavity device can be achieved, incorporating a bulk optic etalon of the type disclosed above together with additional thin film etalons unitary therewith by depositing such thin film etalons thereon using sputtering or other suitable deposition techniques. Any suitable materials disclosed above, and other suitable materials known to those skilled in the art, may be used for the thin films of the thin film etalons including but not limited to $Ta_2O_5$, $ZrO_2$, $TiO_2$, $Al_2O_5$, $SiO_2$, and MgF. The multi-cavity deposition product, described above, is suitable for use, generally together with or in place of the single cavity embodiments of the bulk optic etalons disclosed here.

In accordance with a method aspect, optical filter elements are used to select a single passband from multiplexed light. The optical filter element may comprise numerous configurations, such as those discussed above. For example, the optical filter element may comprise etalon/etalon, etalon/stacked etalons, stacked etalons/stacked etalons, etc. The optical filter elements, including but not limited to the etalons and stacked, optically coupled etalons, may be housed within an optical system. The optical system includes a source of multiplexed light or multiplexed signals divided into multiple channels 1–n, where n is the total number of channels. The multiplexed signals are incident upon the optical filter element, e.g. light entering through a port in an optical fiber is incident on a surface of the optical filter element. The light passes through a first surface of the optical filter element, and certain passbands are passed in accordance with the passband response of the optical filter element or the first portion of the optical filter element, e.g. the first etalon. Passbands that are not passed by the first component of the optical filter element may be reflected and can enter a second port in the optical system. The first output signal from the first component of the optical filter element, e.g. the first etalon, is incident on the first surface of the second component of the optical filter element, e.g. a second etalon. A second output signal, passed by the second optical component, can be received at an additional port, e.g. a third port, for detection. Preferably the second output signal comprises only a single passband. That is, the second output channel comprises only the overlapping passband of the optical components of the optical filter element. One skilled in the art, given the benefit of this disclosure, will recognize that the components of the optical system may be arranged in numerous configurations. For example, the surfaces of the optical filter elements may be in direct and continuous contact, or the surfaces may be separated by an air space. Preferably, the longitudinal axis of the thin film coatings of the etalons, and stacked, optically coupled etalons, are perpendicular to the direction of the optical path.

Optical telecommunication systems and optical sensors comprising optically mismatched etalons and optically mismatched stacked, optically coupled etalons (and combinations thereof) as disclosed above and the methods disclosed for their production and use will be recognized by those skilled in the art to represent a significant technological advance. Robust optically mismatched etalons and optically mismatched stacked, optically coupled etalons can be produced meeting precise optical performance characteristics, with advantageously low production costs and good production flexibility. In preferred embodiments, the optically mismatched etalons and optically mismatched stacked, optically coupled etalons have the advantageous attributes of small size, simple and potentially inexpensive construction, and good optical performance, including low loss, low polarization dependent loss and polarization mode dispersion, and low chromatic dispersion. Additional features and advantages will be understood from the following detailed description of certain preferred embodiments.

BRIEF DESCRIPTION OF THE DRAWINGS

Certain preferred embodiments of the invention will be described below with reference to the attached drawings in which:

FIGS. 10a–10c is a sequential representation of a first embodiment of a method for joining etalons using a bonding material;

FIGS. 13a–13b is a sequential representation of a first embodiment of a method for optically coupling etalons using a coupling member;

FIGS. 14a–14b is a sequential representation of a second embodiment of a method for optically coupling etalons using a coupling member;

FIGS. 20a and 20b are embodiments of optically mismatched stacked, optically coupled etalons.

It will be apparent that the etalons and stacked, optically coupled etalons shown in FIGS. 3–20 are not necessarily to scale. Certain dimensions, such as the thickness of thin film coatings, may have been enlarged relative to other dimensions, such as the thickness of the bulk optic, for clarity of illustration and ease of understanding. Directional references used in this disclosure and detailed description, and in the claims, refer to the orientation shown in FIG. 3 unless otherwise clear from context. It will be understood by those skilled in the art, that the devices disclosed here can be used generally in any orientation relative to gravity and/or other components to which they might be optically and/or physically coupled, e.g., by optical fiber or the like.

DETAILED DESCRIPTION OF CERTAIN PREFERRED EMBODIMENTS

It will be recognized from the above, that the novel etalons and stacked, optically coupled etalons employed in the optical filter elements disclosed here can be formed in innumerable different configurations and sizes. The precise size and configuration of the etalons and the etalons used in the stacked, optically coupled etalons, including the choice of materials, design of the thin films, cavity spacing and the like will depend in large part on the particular application and use environment for which it is intended and its desired optical properties and performance characteristics. For convenience in this more detailed description of certain preferred embodiments, the etalons and the stacked, optically coupled etalons will generally be of a type suitable for use in optical elements of a fiberoptic telecommunication system comprising optically mismatched etalons and optically mismatched stacked, optically coupled etalons. It will be within the ability of those skilled in the art, however, given the benefit of this disclosure, to select suitable materials and designs, as well as manufacturing techniques, for production of etalons and stacked, optically coupled etalons in accordance with the principles of the present invention, suitable for these and other types of applications.

Figure 1:
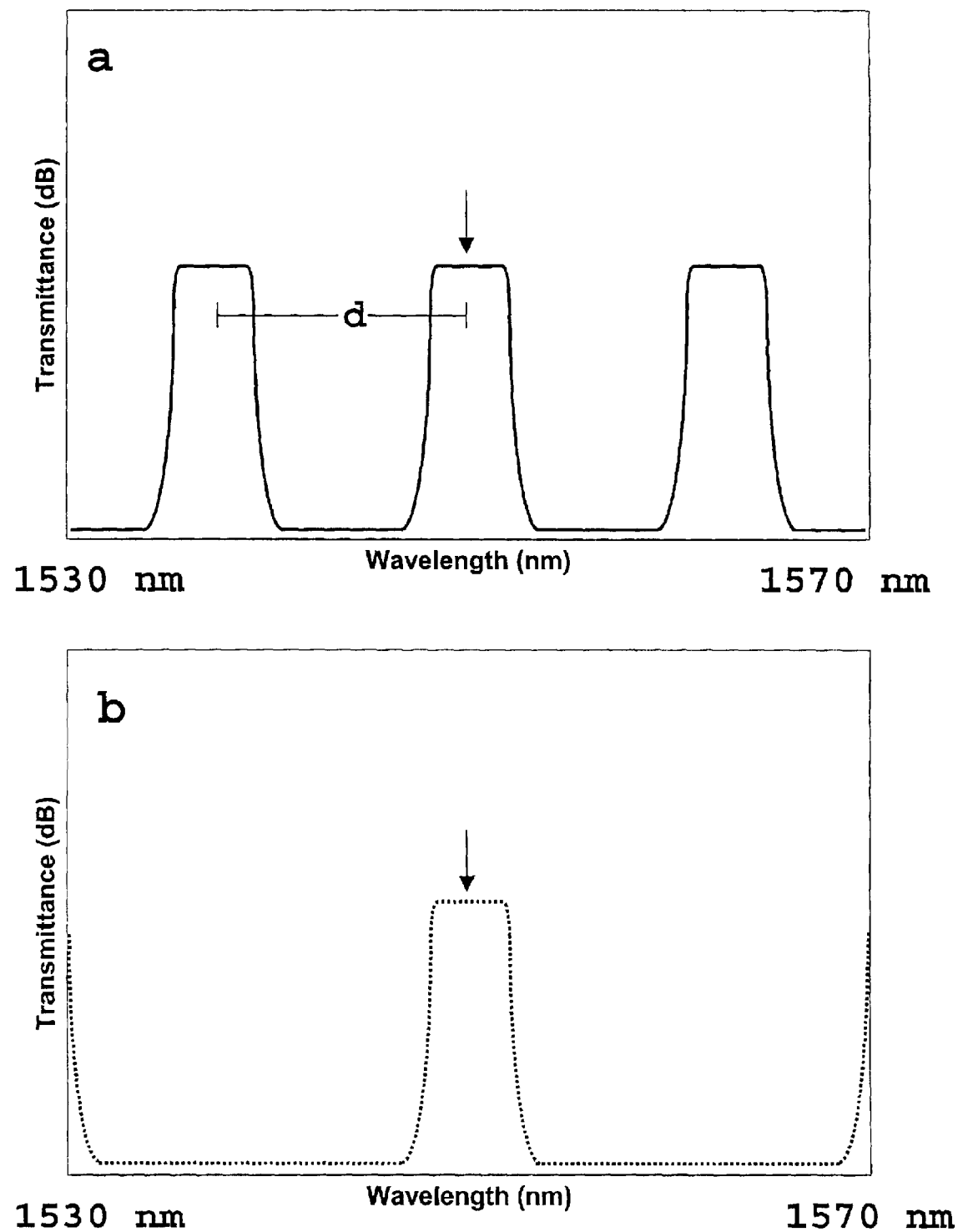
FIGS. 1a and 1b are idealized graphs showing the passband shape of a first and second optical component.
Figure 2:
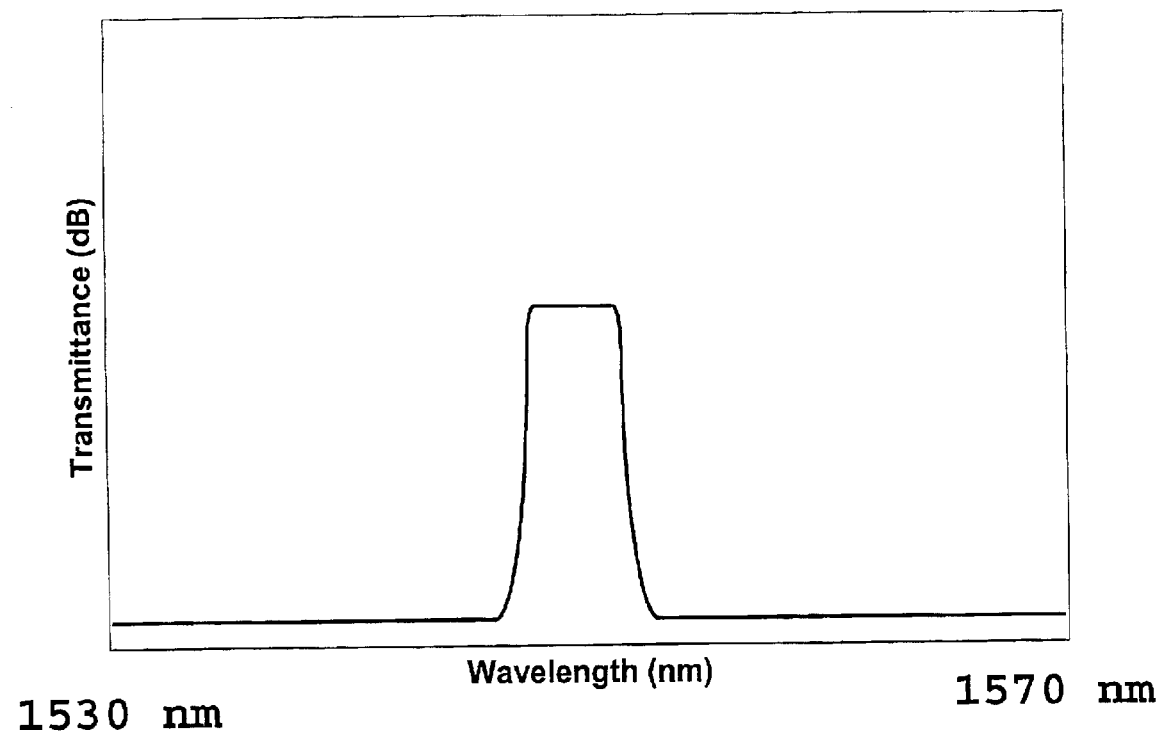
FIG. 2 is an idealized graph showing the passband shape when the first and second optical components of FIGS. 1a and 1b, which are optically mismatched, are placed in the same optical path.

In accordance with preferred embodiments, an optical filter element comprises optically mismatched optical components, such as etalons, for example. Optical mismatching is accomplished by selecting two or more optical components that pass only one overlapping passband. That is, optical mismatching is accomplished by choosing two or more optical components that are functionally different, e.g. have only a single overlapping passband within the wavelength range of interest. A first optical component, such as a first etalon, may be chosen having known optical performance characteristics, such as those optical performance characteristics shown in FIG. 1a, for example. To optically mismatch the first optical components with additional optical components, such as an additional etalon(s), the optical performance characteristics of the additional optical components should be functionally distinct from those of the first optical component. The optical performance characteristics of a second optical component, suitable for optical mismatching with the optical performance characteristics of the first optical component, are shown in FIG. 1b. The optical performance characteristics of the second optical component are suitable because, within the wavelength of interest, only the center passband shown in FIG. 1b (see arrow in FIG. 1b) overlaps with the center passband shown in FIG. 1a (see arrow in FIG. 1a). When placed in the same optical path, all passbands of multiplexed light that are incident on the surfaces of the optical components are filtered out except the overlapping passband (see FIG. 2). Therefore, the optically mismatched optical components can act as a filter to selectively pass only a single passband of multiplexed light. One skilled in the art, given the benefit of this disclosure, will recognize that additional mismatched optical components that selectively pass the same passband may be placed in the optical path.

The preferred embodiments of the optical components are etalons and stacked, optically coupled etalons that are suitable for optical mismatching. The etalons comprise first and second thin film coatings on parallel opposite sides of a cavity formed by a bulk optic comprising a solid, optically transparent body and optionally a wedge coating on a surface of the optically transparent body. The wedge coating underlies the first thin film coating and the axial dimension of the bulk optic, i.e., the optical thickness dimension of the bulk optic in the direction of light passage through the etalon, defines the cavity spacing of the etalon. As used here the term "bulk optic" refers to a component of the etalons disclosed above comprising a solid, optically transparent body, such as a portion of an optically transparent wafer diced into multiple pieces after being coated, together with the wedge coating and/or thickness-adjustment layer. The solid, optically transparent body is an optically transparent substrate having first and second generally flat surfaces on opposite sides, which is self-supporting in the sense that it does not require an underlying support member to retain its shape and integrity during handling, packaging and transport in manners typical for optical elements intended for use as sensors, fiber optic communication system components or the like. Most preferably the transparent body of the bulk optic is a monolithic body, that is, a one-piece, self-supporting and unitary body of material. The transparent body of the bulk optic typically will comprise a portion of an optically transparent wafer. The wedge coating overlies a surface of the transparent body of the bulk optic, and there may or may not be a visible or discernable seam or interface between them. In certain preferred embodiments the wedge coating and thickness adjustment layer are formed of material that is the same as that of the transparent body. It may, therefore, be difficult or impossible to see the boundaries between the transparent body, and the added wedge coating and thickness-adjustment layer. It is, of course, desirable generally that there be no or substantially no optical effect at such boundaries which would adversely impact the performance of the etalon. Thus, the wedge coating and thickness-adjustment coating may be difficult or even impossible to distinguish from the material of the underlying optically transparent body, at least without observing the manner in which the etalon was produced. This typically will not be the case where different materials are used for the optically transparent body, wedge coating and thickness-adjustment coating. In any event, these components of the bulk optic are distinct from each other in the function they perform and in their position in the bulk optic. The thickness of the bulk optic, or the bulk optic materials, may be altered to provide for functionally different etalons that may be used in optical systems comprising optically mismatched optical components. One skilled in the art, given the benefit of this disclosure, will recognize that the properties, such as the thickness, choice of materials, etc., of the other elements of the etalon including but not limited to the bulk optic, thin film coatings, etc. may be altered to provide functionally different etalons.

As discussed further below, the substrate piece forming the body of the etalon preferably is one of many diced from a substantially planar substrate, e.g., a glass, indium phosphide, silica or silicon wafer. Other suitable materials and glasses will be apparent to those skilled in the art given the benefit of this disclosure. Dicing can occur after the wafer has received a wedge coating and a thickness-adjustment layer and the thin film coatings by physical vapor deposition, preferably sputter deposition. Thus, in these preferred embodiments the substrate piece forming the body of the etalon, or the body of each etalon in the stacked, optically coupled etalons, is diced from a larger body sufficiently self-supporting as to be suitable for mounting (with and without spinning) in a vacuum deposition chamber for depositing optically functional coatings or film stacks on one or both sides. The bulk optic component of the etalons disclosed here, in accordance with preferred embodiments, typically is a very small piece of such a wafer. While the wafer often is 4–12 inches in diameter or larger, the coated parallel surfaces of the bulk optic or finished etalon diced from the wafer will generally be in the size range of 0.5 to 5.0 mm across their largest dimension. Thus, numerous etalons can be obtained from each wafer.

Figure 3:
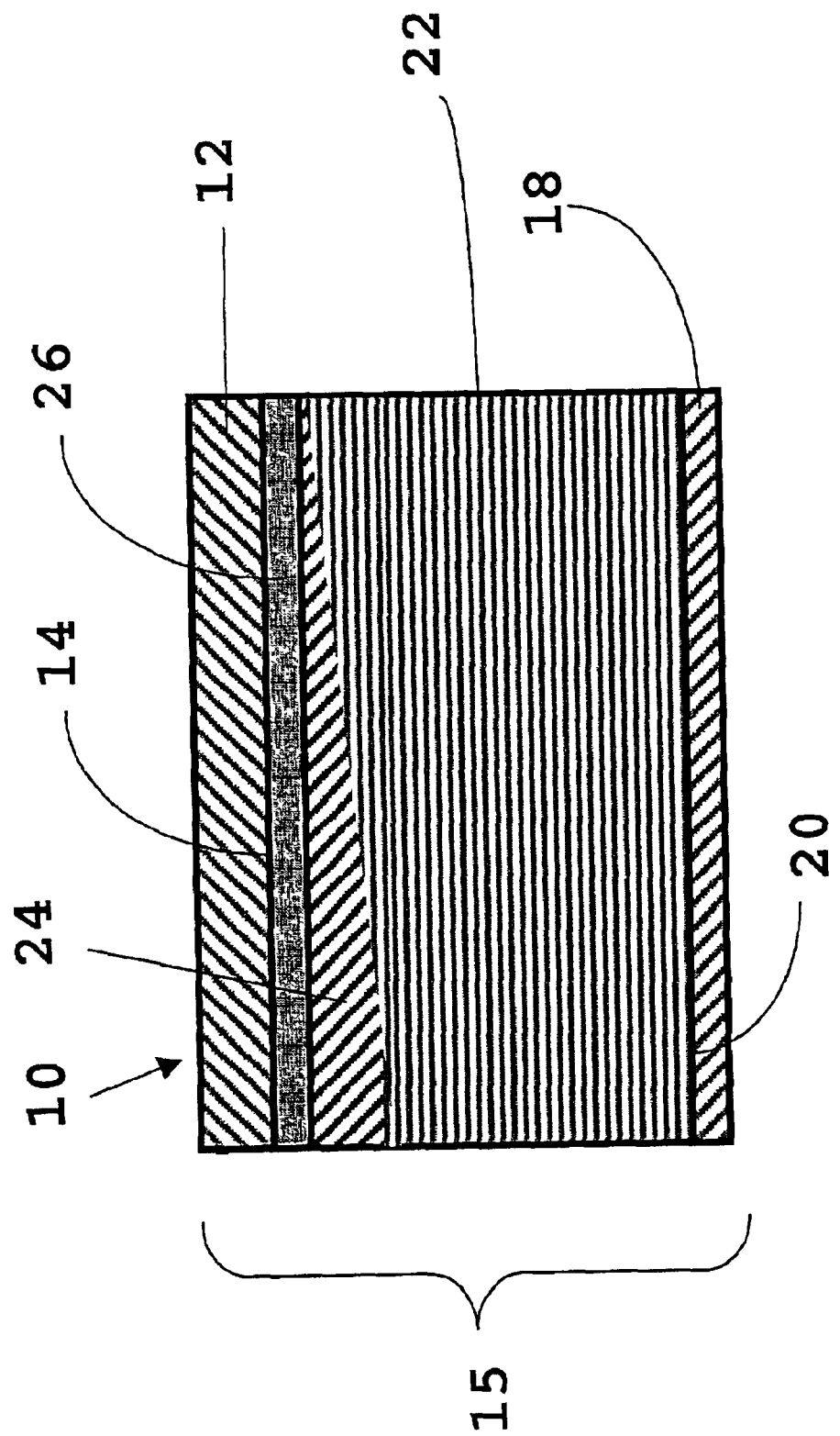
FIG. 3 is a schematic section view of an etalon suitable for optical mismatching and use in the stacked, optically coupled etalons according to one preferred embodiment.

Referring now to FIG. 3, an etalon 10 is seen to comprise a first thin film mirror coating 12 on surface 14 of bulk optic 15 which forms the etalon's cavity. Second selectively transparent thin film mirror 18 is deposited on parallel opposite surface 20 of the bulk optic. The two thin film mirror coatings 12 and 18 are shown as metal mono-layers, preferably identical layers. They are designed in accordance with known parameters to be selectively transparent to the wavelength(s) required by the intended use or application of the finished etalon. In certain embodiments, light that is incident on the selectively transparent surfaces of the etalon has an angle of incidence preferably ≦1°. One skilled in the art, given the benefit of this disclosure will be able to select an angle of incidence suitable for intended use and applications. Suitable fittings for launching light include, for example, a dual fiber collimator, a pair of single fiber collimators, an optical circulator, a 50/50 splitter used with a single fiber collimator, a fiber pigtail, and the like. It will be within the ability of those skilled in the art to employ suitable end fittings to optically launch optical signals into the etalons and stacked, optically coupled etalons described here. In certain embodiments the light is launched from an optical device, such as for example, a laser, collimator, drum lens, ball lens, grin lens, etc. One skilled in the art, given the benefit of this disclosure, will be able to select suitable optical devices for launching light. The bulk optic 15 comprises a solid, optically transparent body 22, wedge coating 24 overlying the optically transparent body, and thickness-adjustment layer 26 sandwiched between the wedge coating 24 and the thin film 12. The axial dimension of the bulk optic, i.e., the dimension of the bulk optic in the direction of light passage, defines the cavity spacing of the etalon. The precise optical thickness of the bulk optic will be adjusted slightly to compensate for the non-zero thickness of the metal films to preserve or optimize transparency at the precise wavelength(s) of interest. The optically transparent body 22 preferably is a monolithic body formed of silica or other suitable glass. The wedge coating and the thickness-adjustment layer each preferably is a layer of silica, glass, etc., most preferably being formed of the same material as the optically transparent body 22. The wedge coating overlies a surface of the transparent body of the bulk optic, and there may or may not be a visible or discernable seam or interface between them. In certain preferred embodiments the wedge coating and optional thickness adjustment layer are formed of material that is the same as that of the transparent body. In other preferred embodiments, the wedge coating and/or thickness-adjustment layer are formed of a material comprising substantially the same refractive index as the material comprising the optically transparent body, e.g. the refractive indices differ by less than about ±0.01. It may, therefore, be difficult or impossible to see the boundaries between the bulk optic, the wedge-correction layer and the thickness-correction layer. It is, of course, desirable generally that there be no or substantially no optical effect at such boundaries which would adversely impact the performance of the etalon. Thus, the wedge coating and thickness-adjustment coating may be difficult or even impossible to distinguish from the material of the underlying optically transparent body, at least without observing the manner in which the etalon was produced. This typically will not be the case where different materials are used for the optically transparent body, wedge coating and thickness-adjustment coating. In any event, these components of the bulk optic are distinct from each other in the function they perform and in their position in the bulk optic.

Wedge coating 24 can be seen in FIG. 3 to have a progressively increasing axial dimension from right to left in the cross-sectional view of FIG. 3. In a typical embodiment, the cross-sectional view obtained by cutting in a plane perpendicular to the plane of the paper in FIG. 3 would show a substantially constant axial dimension for the wedge layer. The combined thickness of wedge coating 24 and optically transparent body 22 is substantially constant over at least a large (i.e., sufficiently large for the intended use of the etalon) area of the etalon. Such parallelism is achieved in accordance with preferred embodiments through a combination of substrate polishing and the wedge coating. An optical wafer suitable for mounting in a sputtering chamber is subjected to a polishing process in accordance with known techniques and commercially available equipment. Such polishing processes typically produce finished substrates to within 2 arc seconds, preferably 1 to 2 arc seconds of wedge (shown exaggerated in FIGS. 1 and 2) and a wavefront error of less than $\frac{1}{50}$ of a wave at 1550 nm. Low wavefront error will be understood in this context to mean that the thickness variation across the substrate is controlled by (i.e., essentially due to) the wedge. A wedge coating is then formed on one or both surfaces of the substrate to compensate for, that is, to offset, the wedge; net wedge after the wedge coating can be reduced to less than 0.1 arc second, less than 0.01 in preferred embodiments. The wedge coating can be formed by physical vapor deposition technique, such as magnetron sputtering, ion beam sputtering, or other sputtering method. Preferably the wedge coating is deposited on the optically transparent body by sputter deposition from a source in a vacuum chamber, the optically transparent body being mounted within the vacuum chamber without spinning during deposition and asymmetrical to the source. That is, in accordance with certain preferred embodiments, the substrate wafer is mounted in the vacuum chamber with no spinning and offset at an angle to the target or source. The thinner portion of the substrate is placed closest to the target to receive the highest rate of deposition. The thickest portion is furthest from the target. In preferred embodiments, the wedge coating is deposited so that the thickness of the wedge coating at its thickest point is less than 1 micron and more preferably less than 100 nm. Alternatively or in addition, shielding or other techniques can be used to achieve differential deposition rate across the substrate wafer. It will be within the ability of those skilled in the art to determine the proper distance and angle of offset to obtain good yield of wafer surface area having substantially uniform thickness. In that regard, substantially uniform, as that term is used here, means that the thickness of the wafer, including the bulk optic plus the wedge-correction layer, is sufficiently uniform over an area the size of a chip or segment to be cut later from the wafer, most preferably a large number of such chips or segments, to provide satisfactory optical precision in or as an etalon. Similarly, the precision of the thickness of the bulk optic with the thickness-adjustment layer added during thickness correction must be sufficient to provide satisfactory optical precision in the functioning of the etalon.

Figure 4B:
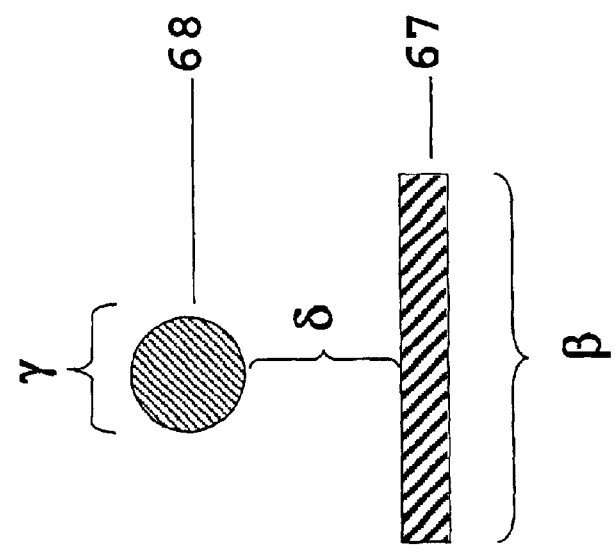
FIG. 4a is a schematic section view and FIG. 4b is a frontal view of a substrate positioned within a deposition chamber.
Figure 4A:
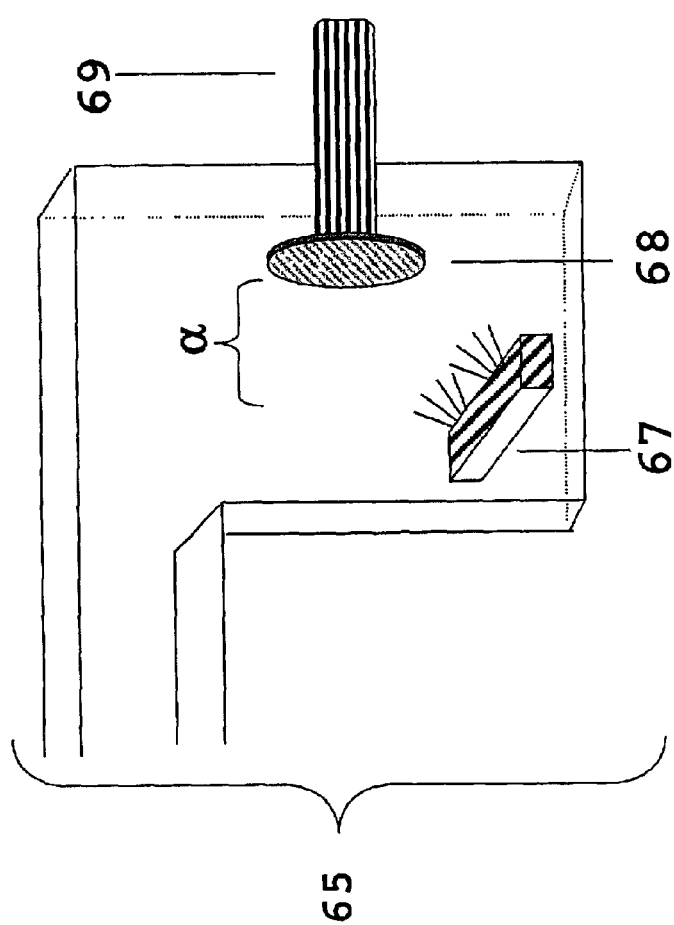

It will be within the ability of those skilled in the art to select or empirically determine suitable orientations and positions of the substrate within a deposition chamber to achieve suitable deposition of wedge coating onto the substrate. Referring to FIGS. 4a and 4b, an embodiment of a chamber suitable for depositing a wedge coating onto a substrate is shown. The chamber 65 comprises an elongate source or target 67, e.g. a rectangular source, and a substrate 68, for receiving a wedge coating, which is held in place by device 69. In preferred embodiments, the length β of target 67 is about three times larger than the diameter γ, or other length as the case may be, of the substrate 68. Target 67 may be positioned at distances α and δ from substrate 68. One skilled in the art, given the benefit of this disclosure, will be able to select or empirically determine dimensions for α and δ to achieve suitable deposition of wedge coating onto the substrate. The wedge coating is typically deposited without spinning substrate 68, and substrate 68 is positioned in the chamber so that the thinner portion of the substrate is placed closest to target 67 to receive the highest rate of deposition.

Total coating thickness to substantially eliminate a 1 arc second wedge is typically about 4–8 quarter waves (of the intended light wavelength that the etalon will be used with) depending on source geometry. Preferably the coating is controlled by optical monitoring, most preferably monitoring of two points on the wafer substrate during deposition. Coating can be halted when the thickness is the same at the two points along the direction of wedge. It should be noted that for clarity of explanation, the optically transparent body is still treated here as having its original wedge; the bulk optic comprising both that body and the wedge layer has the substantially constant net thickness.

In the preferred embodiment of FIG. 3, the thin film coatings each comprises a sputter-deposited mono-layer of metal, that is, a single layer of metal such as would be deposited by sputter deposition without any intervening or other deposited layers (excepting, for example, anti-reflection films, transparent protective overcoats or the like, as those skilled in the art would recognize), and preferably without any intervening change of target material, vacuum chamber atmosphere or the like during deposition of the mono-layer. Exemplary metal layers (understood to include impurities, trace elements, optionally doping agents or the like, and to have an actual deposited form which may not be entirely a true metallic form) include silver, aluminum, tantalum, zirconium and magnesium. Other suitable materials will be readily apparent to those skilled in the art given the benefit of this disclosure. Such metal mono-layers in certain embodiments are slightly absorptive and the resulting etalon can be advantageously adapted for use as an induced transmission filter, useful for example in optical elements for certain medical applications. In preferred embodiments, the longitudinal axis of the thin film coatings is perpendicular to the direction of the optical path.

As noted above, the bulk optic component of the etalon of FIG. 3 comprises a thickness-adjustment layer 26 of substantially uniform thickness. Such layers may be, e.g. 0–100 microns, typically being between 1 and 10 microns thick, preferably less than about 5 microns thick, for example about 2 microns thick. Optical monitoring can be used to control deposition of the thickness-adjustment layer. The deposition is controlled such that total thickness achieves the desired half wave condition for the bulk optic component of the etalon, which corresponds to the wavelength at which the etalon is to be resonant. The thickness of the thickness adjustment layer may be altered to provide etalons that are functionally different and suitable for use in optical systems comprising optically mismatched optical components.

Figure 5:
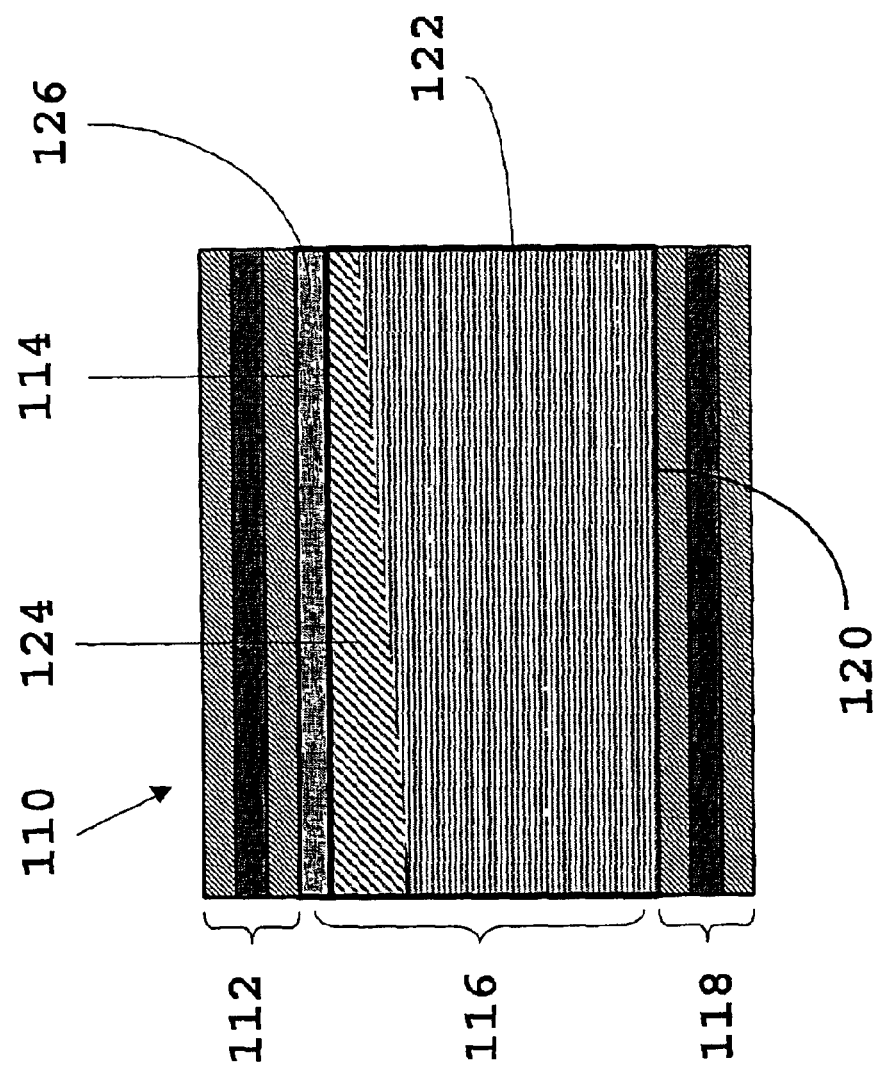
FIG. 5 is a schematic section view of an etalon suitable for optical mismatching and use in the stacked, optically coupled etalons according to a second preferred embodiment.

Referring now to FIG. 5, an etalon 110 is seen to comprise a first thin film coating 112 on surface 114 of bulk optic 116 that forms the etalon's cavity. Second thin film 118 is deposited on parallel opposite surface 120 of the bulk optic. The bulk optic 116 comprises a solid, optically transparent body 122, wedge coating 124 overlying the optically transparent body, and thickness-adjustment layer 126 sandwiched between the wedge coating 124 and the thin film 112. The axial dimension of the bulk optic, i.e., the dimension of the bulk optic in the direction of light passage, defines the cavity spacing of the etalon. The optically transparent body 122 preferably is a monolithic body as described above in connection with the embodiment of FIG. 3. Materials suitable for the optically transparent body, wedge coating and thickness-adjustment layer include those discussed above. The Fabry-Perot thin film mirror coating 112 and 118 in the embodiment of FIG. 5 are dielectric film stacks of alternating high and low index of refraction. That is, the two thin film mirror coatings 112, 118 are formed of alternating sputtering-deposited layers of low refractive index material and high refractive index material, often referred to as H/L/H film stacks. For representative purposes, each is shown as having three films in its film stack; typically, as is well known to those skilled in the art, film stacks comprising many more alternating films may be used to achieve desired optical performance characteristics. Typically, coatings 112 and 118 will have substantially identical film stacks. Selecting a suitable number of alternating layers and suitable film materials will be within the ability of those skilled in the art given the benefit of this disclosure. Preferably the film stacks are deposited by reactive magnetron sputtering, ion beam sputtering or other suitable technique, a number of which will be readily apparent to those skilled in the art given the benefit of this disclosure. Exemplary dielectric materials for the high refractive index layers of the film stack include $Ta_2O_5$, $ZrO_2$, and $Al_2O_3$. Exemplary dielectric materials for the low refractive index layers of the film stack include $SiO_2$ and MgF. Additional suitable materials will be readily apparent to those skilled in the art given the benefit of this disclosure.

Figure 6:
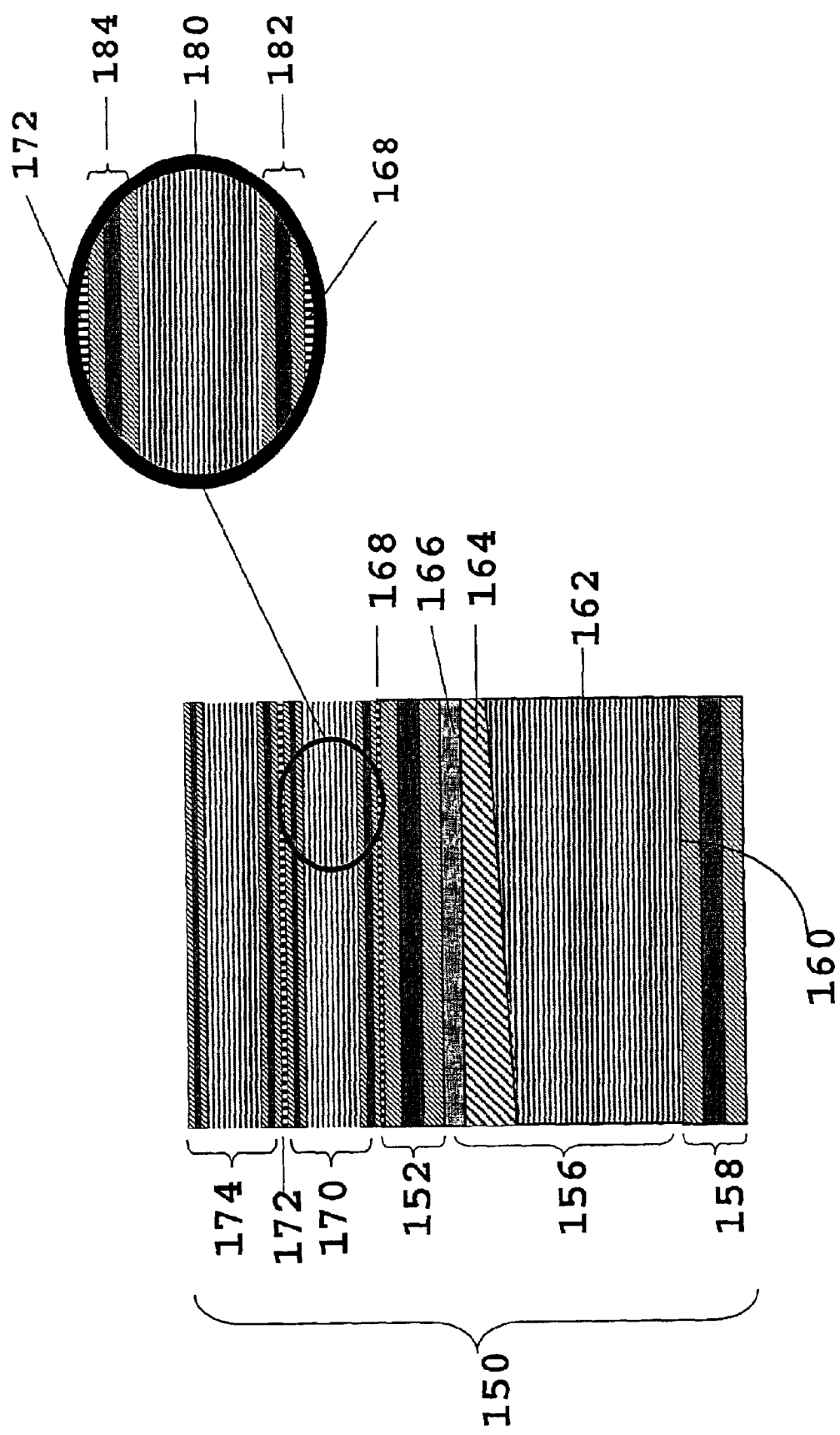
FIG. 6 is a schematic section view of an etalon comprising a thin film cavity deposited thereon.

In accordance with preferred embodiments, a multi-cavity etalon 150 comprising a bulk optic 156, thin film coatings 152 and 158, transition layers 168 and 172, and thin film etalons 170 and 174 is shown in FIG. 6. Typically the thin film etalons 170 and 174 are not optically matched with the bulk optic etalon but instead may be optically mismatched, e.g. the thin film etalon and the bulk optic etalon have a single common passband. Bulk optic 156 comprises an optically transparent body 162 and optionally a wedge coating 164 and thickness adjustment layer 166. On first side 160 of the bulk optic is thin film mirror coating 158. On the opposite side of the bulk optic is thin film mirror coating 152. After deposition of thin film mirror coatings 152 and 158, additional thin film coatings and cavity films may be deposited onto thin film coating 152 and/or onto thin film coating 158. Prior to deposition of the thin film coatings and cavity films of the thin film etalon, a first transition layer 168 is deposited using sputtering or other suitable techniques, e.g. ion beam sputtering, magnetron sputtering, etc. The first transition layer 168 is in direct surface-to-surface contact with thin film stack 152. Thin film coating 182, such as an H/L/H thin film stack for example, may be deposited onto transition layer 168. After deposition of thin film coating 182, a cavity film 180 may be deposited onto thin film coating 182. After deposition of the cavity film 180, second thin film coating 184 may be deposited onto cavity film 180. Therefore, a thin film etalon typically a comprises a first thin film coating or stack, the cavity film, and a second thin film coating or stack. A second transition layer 172 may be deposited onto first thin film etalon 170, and the process just described may be repeated to provide deposition of additional thin film etalons, such as thin film etalon 174. In preferred embodiments, the thickness of the transition layer typically is an odd integer number (e.g. 1, 3, 5, 7 . . . ) of quarter wavelengths optical thickness (QWOTs). Typically the cavity film of the additional thin film etalons is deposited to a half-wave condition or an integral number of half waves. For example, in certain embodiments, the thickness of the cavity film can be from 1 to 10 half waves corresponding to about 0.5 to 5 microns for silica cavity film in an etalon operative in the C band. The thickness of the thin film coatings, of the thin film etalons, is preferably equal to an integral number of half waves.

In accordance with certain preferred embodiments, methods are provided of making an etalon, suitable for optical mismatching with other etalons, as disclosed above. Such methods comprise the step of polishing at least one surface of an optically transparent substrate to produce an optically transparent body having opposite sides parallel preferably to within 5 arc seconds, more preferably to within 2.0 arc seconds. As discussed above, polishing does not reliably give adequate parallelism for etalons intended for use in communication systems, etc. The methods further comprise depositing an optically transparent wedge coating on at least one of the opposite sides of the optically transparent body to produce a bulk optic having opposite sides parallel to within less than about 0.4 arc seconds, more preferably less than about 0.2 arc seconds, most preferably, for higher performance etalons, less than 0.1 arc second. Continual two-spot optical monitoring can be used to control deposition of the wedge coating as disclosed above. Reference here to "continually" monitoring thickness during deposition should be understood to meaning optionally, but not necessarily, monitoring continuously, and optionally monitoring regularly or repeatedly during the deposition.

The methods further comprise depositing a first selectively transparent thin film mirror coating on a first one of the opposite sides of the bulk optic and depositing a second such thin film coating on a second one of the opposite sides of the bulk optic to produce an etalon wherein the thickness of the bulk optic defines the cavity spacing of the etalon.

In accordance with certain preferred embodiments of the method described immediately above, approximately one-half of the total thickness of the desired wedge coating is deposited by sputter deposition, without rotation, onto a first side of an optically transparent substrate. The substrate and wedge coating may, for example, both be $SiO_2$. The first thin film coating is deposited over such wedge layer. The second one-half of the total thickness of the desired wedge coating then is deposited by sputter deposition, without rotation, onto the second side of the optically transparent substrate. Further, deposition then continues until sufficient quarter waves are coated on to this second half of the wedge to reach the desired total thickness, stopping deposition at a half wave condition. In accordance with certain preferred embodiments, the thickness-adjustment layer has a substantially uniform thickness between 0 and 100 microns more preferably between 1–5 microns. The second thin film coating is deposited over the wedge/thickness correction layer. In accordance with certain preferred embodiments, the first thin film coating and the second thin film coating are substantially identical and substantially optically transparent to at least one wavelength for which the etalon is resonant. Preferably, the transparent substrate is a wafer having a diameter greater than 3 inches and a thickness dependent on the intended optical properties. For production of optical bandpass filters, for example, for use in an optical communication systems in the C-band, a wafer having a thickness of about 0.5 mm is suitable with a finished thickness, after deposition of the wedge coating and thickness-adjustment layer, of about 0.5 mm for the etalon cavity. For etalons and stacked coupled etalons intended for the same application, but having a bandpass every 100 GHz, a substrate wafer having a thickness of about 1.0 mm is suitable. For etalons intended for the same application, but having a bandpass every 50 GHz, a substrate wafer having a thickness of about 2.0 mm is suitable. In general, it will be within the ability of those skilled in the art, given the benefit of this disclosure, to select substrate wafers of suitable thickness for forming the bulk optic cavity of the optical filter elements disclosed here. Similarly, it will be within the ability of those skilled in the art given the benefit of this disclosure, to deposit wedge coatings and thickness-adjustment layers of suitable thickness on such substrate wafers to produce etalon cavities having an optical thickness proper for the intended application of the optical element, e.g. for optical mismatching. The method further comprises the step of dicing the wafer into multiple coupons and/or etalons following deposition of the first and second thin film coatings. Dicing the wafer typically is accomplished by sawing or grinding through the wafer in accordance with methods and equipment whose applicability to the present invention will be readily apparent to those skilled in the art given the benefit of the present invention. The parallel sides of such diced coupons, having the thin film coating thereon, preferably are 0.5 to 5.0 mm across the largest dimension.

Figure 7:
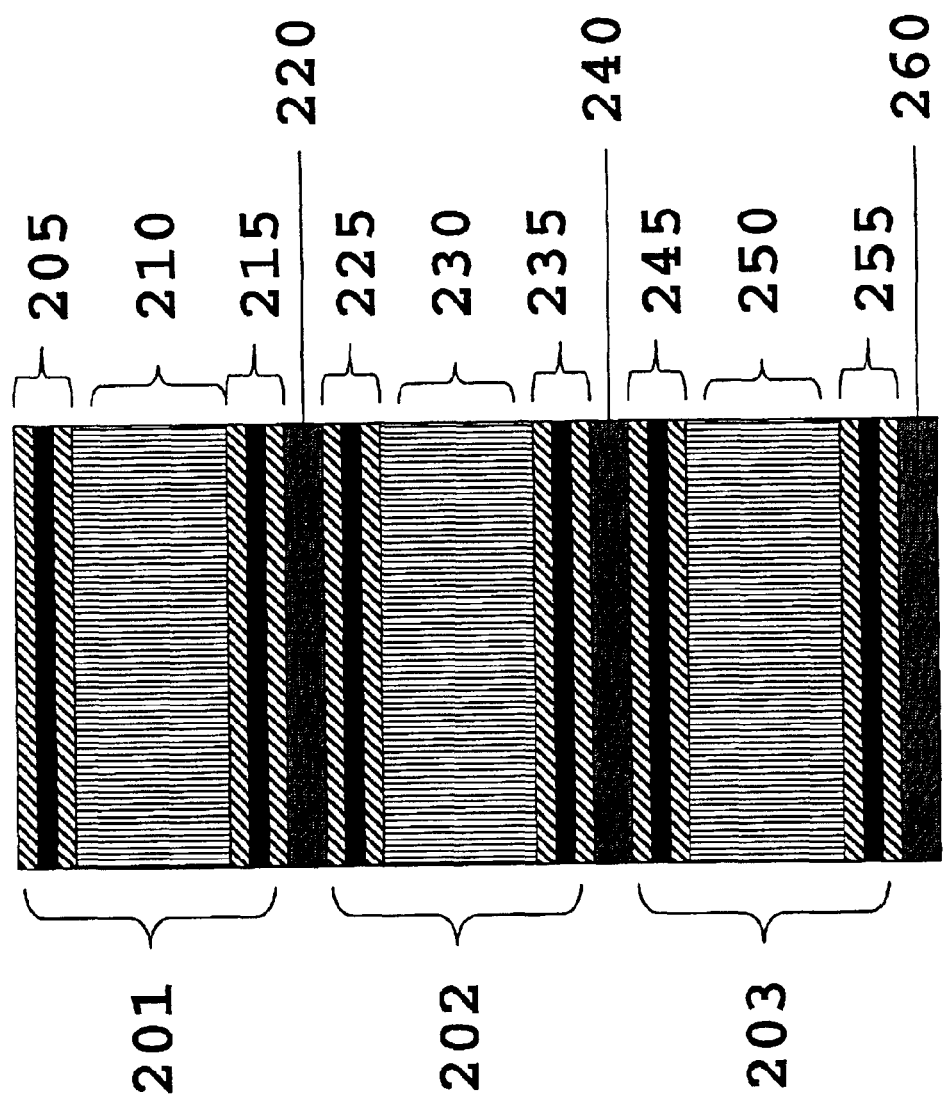
FIG. 7 is a schematic section view of a stack of optically coupled etalons in accordance with a preferred embodiment.

FIG. 7 illustrates schematically a preferred embodiment of the stacked, optically matched and optically coupled etalons disclosed here, suitable for use in optical mismatching. Each etalon comprises the components of the etalon shown and described in FIG. 5 including a bulk optic 210 comprising thin film coatings 205 and 215. A first etalon 201, comprising the thin film coatings 205 and 215 and a bulk optic 210, is coupled to a second etalon 202, comprising thin film coatings 225 and 235 and a bulk optic 230, using an optically transparent bonding layer 220. The second etalon 202 is coupled to a third etalon 203, comprising thin film coatings 245 and 255 and bulk. optic 250, using a transparent bonding layer 240. Each bulk optic may also comprise a thickness adjustment layer (not shown) and a wedge coating (not shown) underlying the thin film coatings. Additional etalons may be joined to the stack of optically coupled etalons described herein, e.g. by joining additional etalons via layer 260, which comprises a transparent bonding material. The number of coupled etalons is not limited to the number shown and described herein. One skilled in the art, given the benefit of this disclosure, would recognize that a plurality of etalons may be coupled together by addition of more bonding layers and more etalons. One skilled in the art will also recognize, given the benefit of this disclosure, that one or more etalons having different passbands may be coupled.

In accordance with preferred embodiments, the bonding material in layers 220, 240, and 260 shown in FIG. 7 may each comprise any optically transparent material that is capable of bonding two or more etalons together. In preferred embodiments, the bonding material is deposited to a thickness equal to an odd number of QWOTs after the etalons are joined together. In certain embodiments, fritted glass is used to join the etalons together. The flitted glass is preferably deposited using a vapor deposition process or a sputter deposition process. The fritted glass may be deposited on both surfaces of a wafer, a coupon or an etalon. Alternatively, the fritted glass may only be deposited on one surface of a wafer, a coupon, or an etalon. The fritted glass is deposited so that the thickness of the fritted glass is equal to an odd number of QWOTs when the etalons are joined together. After deposition of the fritted glass on the wafers, coupons or etalons, the fritted glass can be heated to melt or soften the flitted glass. Placement of the wafers, coupons, or etalons in contact and re-solidification of the fritted glass results in joining of the wafers, coupons, or etalons. One skilled in the art would recognize that materials with similar properties and characteristics as fritted glass may be used to join the etalons together. In certain embodiments, a portion of the fritted glass is etched away to leave "feet" or projections on the surfaces of the wafers, the coupons, or the etalons. The "feet" may be treated similar to the fritted glass to join the wafers, coupons, or etalons together. In certain preferred embodiments, the bonding material comprises an epoxy or other adhesive or small beads in an adhesive. In preferred embodiments, the small bead/adhesive mixture is deposited to form a monolayer of beads after the wafers, coupons, or etalons are joined together. The uniform size of the beads provides for uniform spacing between adjacent coupled wafers, coupons, or etalons. In other preferred embodiments, the bonding material comprises EPO-TEK 353ND.

In additional preferred embodiments, the bonding layer is omitted and the etalons are placed into optical contact. Without wishing to be bound by theory, it is currently understood that when placed into optical contact, electrostatic forces hold the etalons together. Optionally, a coupling member may be used to maintain the optical contact. This coupling member may be any device capable of maintaining the etalons in position in the stack, e.g. a rigid jacket, a sleeve, etc.

Figure 8:
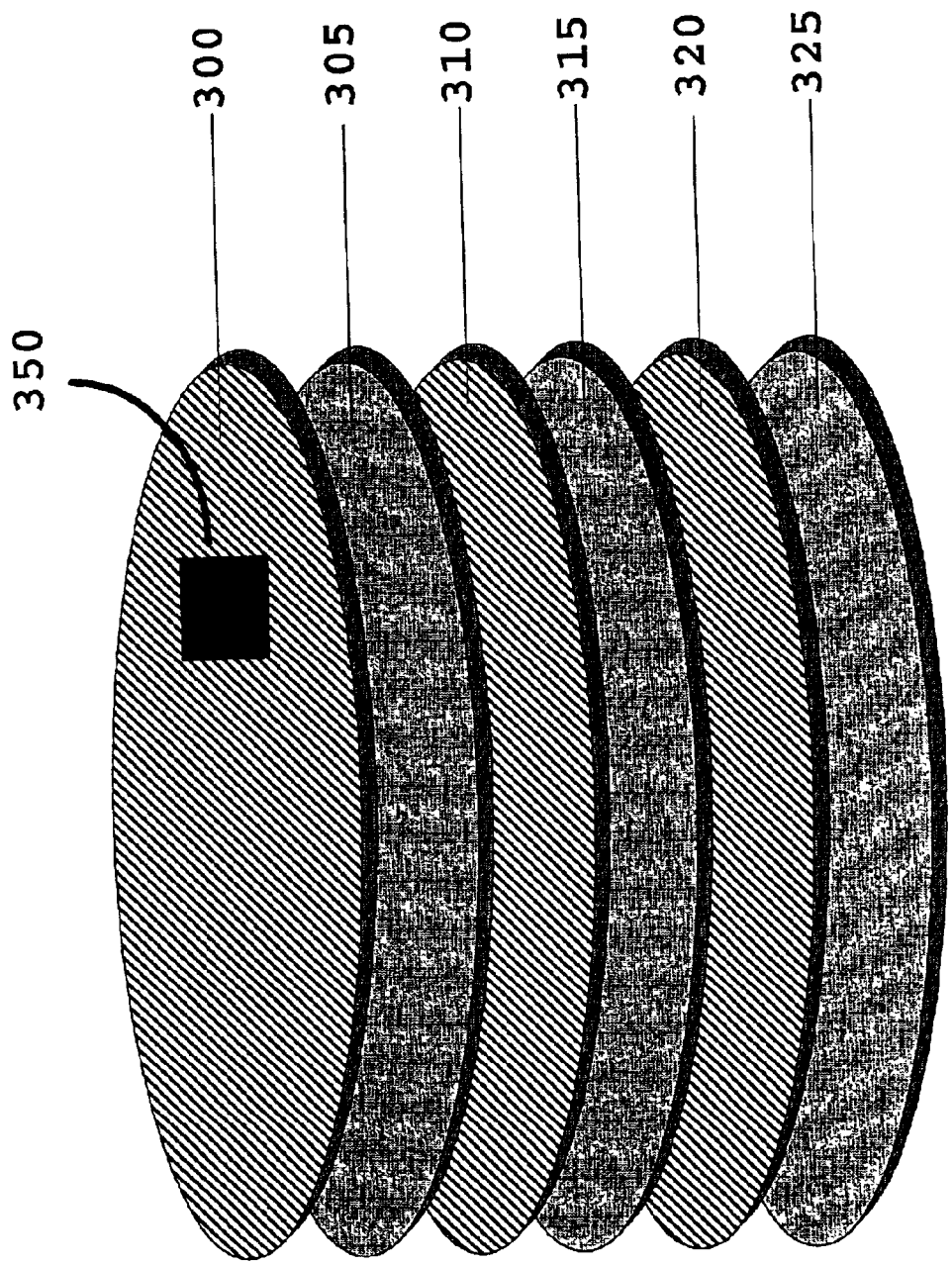
FIG. 8 is an exploded view of a stack of wafers.

In accordance with preferred embodiments, an exploded view of a method for production of stacked, optically coupled etalons, suitable for optical mismatching, is shown in FIG. 8. In this embodiment, wafers are joined together using a bonding material. A first wafer 300 and a second wafer 310 each comprises a bulk optic and thin film coatings. The bulk optic of the wafers may optionally comprise a thickness adjustment layer (not shown) and a wedge coating (not shown) underlying the thin films. A bonding material may be deposited onto one or more of the surfaces of the first wafer 300 or the second wafer 310. Preferably this bonding material is deposited using vapor deposition, sputter deposition, or other deposition processes known in the art. One skilled in the art would recognize that deposition of the bonding material on both surfaces is possible, but unnecessary, since only a single bonding layer is required between wafers to join the wafers together. After joining of the first and second wafers, a bonding layer 305 is created. Preferably the thickness of bonding layer 305 is equal to an odd number of QWOTs. A bonding material is also deposited on the surfaces of a third wafer 320. Third wafer 320 may also comprise thin film coatings and a bulk optic that optionally comprises a wedge coating and a thickness-adjustment layer. After joining the third wafer 320 to the second wafer 310, a bonding layer 315 is created. Preferably, the thickness of bonding layer 315 is equal to an odd number of QWOTs. One skilled in the art, given the benefit of this disclosure, would recognize that additional wafers may be joined to the third wafer using the method just described. Preferably, the thickness of any additional bonding layers are each equal to an odd numbers of QWOTs. The thickness of individual wafers may be the same or may be different. In preferred embodiments, separate wafers are used having variable thicknesses. The differing thickness in the wafers can result in formation of optically mismatched stacked, optically coupled etalons. That is, stacked, optically coupled etalons may be produced using the method described, wherein individual etalons of the stacked, optically coupled etalons are functionally different. The resulting optical filter element comprises a stack of optically coupled and optically mismatched etalons that is suitable for use in optical systems.

Figure 9:
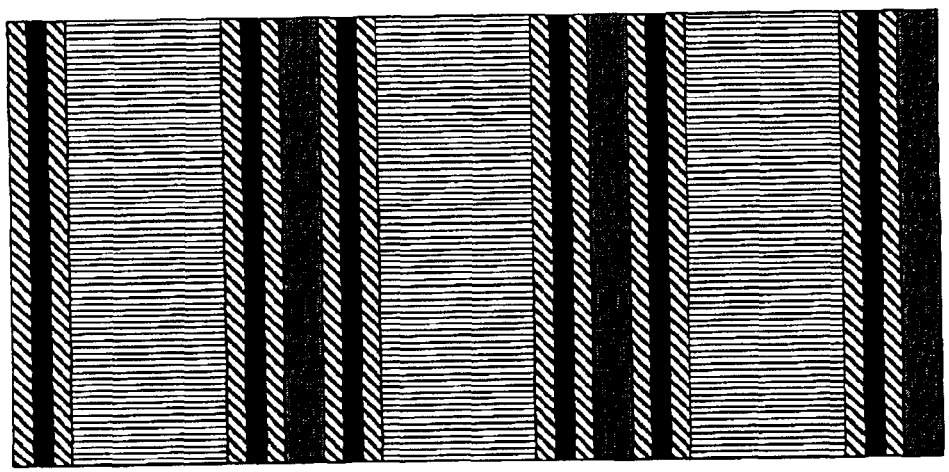
FIG. 9 is a section view of a stacked etalon diced from the stacked wafers shown in FIG. 4.

The method immediately described provides a robust and rapid method for rapidly assembling stacked wafers. In accordance with preferred embodiments, the wafers may but cut or diced into smaller fragments known as "coupons." The coupons may further be diced into one or more stacked, optically coupled etalons as shown in FIG. 9. The diced stacked, optically coupled etalons may be tested for specific properties. Stacked, optically coupled etalons having similar properties, i.e. optically transparent to the same wavelength, may be optically mismatched with other etalons or stacked, optically coupled etalons to form optical filter elements, and the optical filter elements can be incorporated into optical communications devices or optical sensors. In other embodiments, the optical performance of stacked optically coupled and optically mismatched etalons may be tested, and those stacked optically coupled and optically mismatched etalons that act to select a single channel of light from multiplexed light may be incorporated into optical elements, optical communication devices, or optical sensors.

In accordance with preferred embodiments, a method for production of stacked, optically coupled etalons, suitable for optical mismatching, is shown in FIGS. 10a–10c. In this embodiment, individual etalons are stacked and coupled using bonding layers. A first etalon 400, a second etalon 405, and a third etalon 410 each comprise the components of the etalon shown and described in FIG. 5 including thin film coatings 402 on both surfaces of a bulk optic 404 (see FIG. 10a). The bulk optic may also comprise a thickness adjustment layer (not shown) and a wedge coating (not shown) underlying the thin films. A bonding material 406 is deposited on the surfaces of the first, second, and third etalons (see FIG. 10b). Preferably this bonding material is deposited using vapor deposition, sputter deposition, or other deposition processes known in the art. After joining the first, second, and third etalons, bonding layers 420 are created (see FIG. 10c). Preferably the thickness of each bonding layer is equal to an odd number of QWOTs. One skilled in the art will recognize, given the benefit of this disclosure, that additional etalons may be coupled to the third etalon using the method just described. The thickness of the bonding layers that would be created by adding additional etalons are preferably each equal to an odd number of QWOTs. One skilled in the art, given the benefit of this disclosure, will also recognize that functionally different etalons, e.g. optically mismatched etalons, may be coupled using the method immediately described above to create stacked, optically coupled and optically mismatched etalons.

Figure 11C:
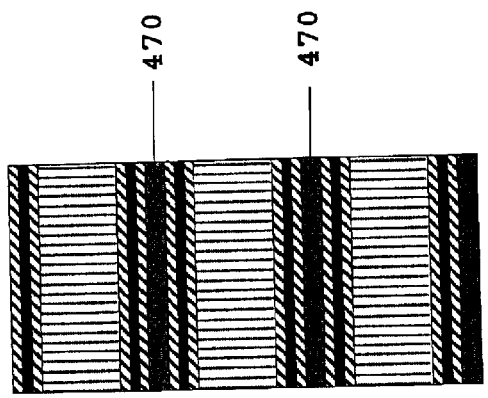
FIGS. 11a–11c is a sequential representation of a second embodiment of a method for joining etalons using a bonding material.
Figure 11B:
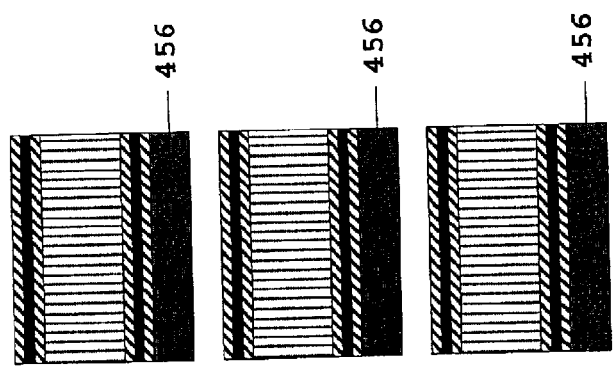
Figure 11A:
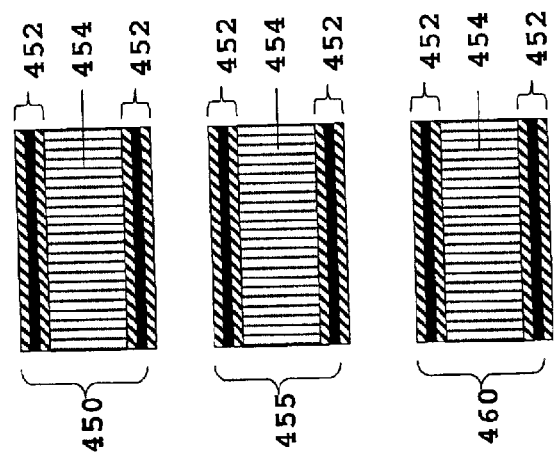

In accordance with preferred embodiments, a method for production of stacked, optically coupled etalons, suitable for optical mismatching, is shown in FIGS. 11a–11c. In this embodiment, individual etalons are stacked and coupled using bonding layers. A first etalon 450, a second etalon 455, and a third etalon 460 each comprise the components of the etalon shown and described in FIG. 5 including thin film coatings 452 on both surfaces of a bulk optic 454 (see FIG. 11a). The bulk optic may also comprise a thickness adjustment layer (not shown) and a wedge coating (not shown) underlying the thin films. A bonding material 456 is deposited on one surface of the first, second and third etalons (see FIG. 11b). Preferably this bonding material is deposited using vapor deposition, sputter deposition, or other deposition processes known in the art. The bonding layer is deposited on one surface of the two etalons that are to be coupled. After joining the first, second, and third etalons, bonding layers 470 are created (see FIG. 11c). Preferably the thickness of each bonding layer is equal to an odd number of QWOTs. One skilled in the art would recognize, given the benefit of this disclosure, that additional etalons may be coupled to the third etalon using the method just described. An advantage of this method is that the bonding material need only be deposited on one surface of the etalons. Therefore, the process of assembling stacked, optically coupled etalons is more efficient. In accordance with other preferred embodiments, the bonding layer may comprise any optically transparent material that is capable of bonding two or more etalons together, such as those materials previously discussed above. One skilled in the art, given the benefit of this disclosure, will recognize that functionally different etalons, e.g. optically mismatched etalons, may be coupled using the method immediately described above to create stacked, optically coupled and optically mismatched etalons.

In accordance with other preferred embodiments, the bonding layer comprises fritted glass. The fritted glass is preferably deposited using a vapor deposition process or a sputter deposition process. The fritted glass may be deposited on both surfaces of the etalon. Alternatively, the fritted glass may only be deposited on one surface of the etalon. The fritted glass is deposited so that the thickness of the fritted glass is equal to an odd number of QWOTs when the etalons are joined together. After deposition of the fritted glass on the etalons, the etalons may be joined by heating of the fritted glass. Melting and re-solidification of the fitted glass results in joining of the etalons.

Figure 12D:
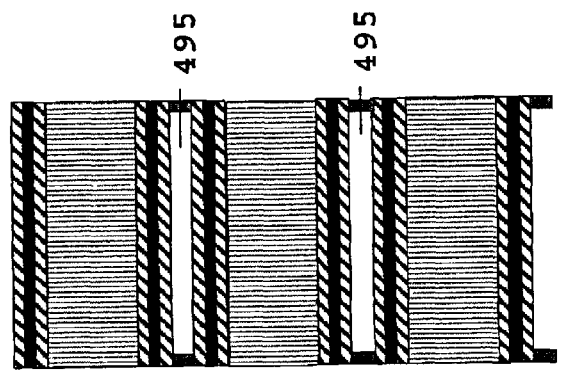
FIGS. 12a–12d is a sequential representation of a third embodiment of a method for joining etalons using feet.
Figure 12C:
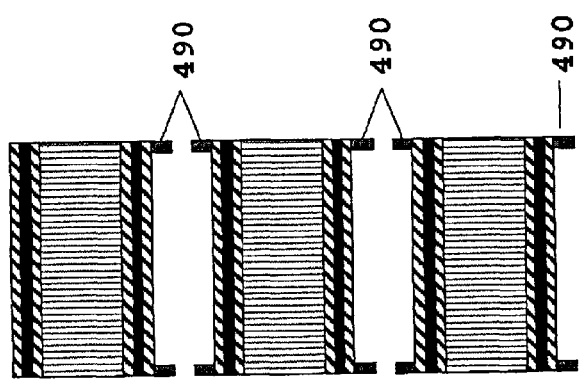
Figure 12B:
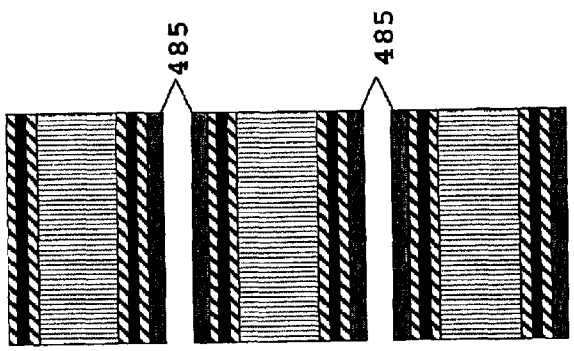
Figure 12A:
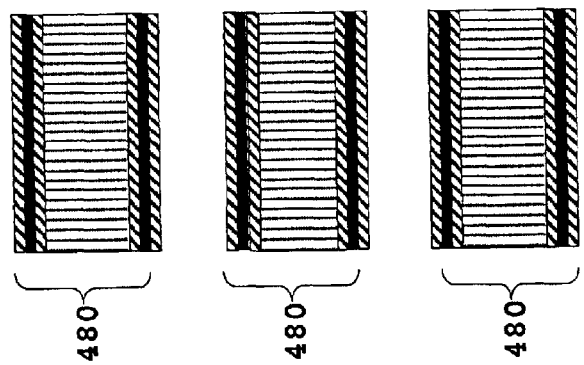

In accordance with additional preferred embodiments, flitted glass feet may be used to assemble the stacked, optically coupled etalons. As shown in FIG. 12a, each etalon 480 may comprise thin film coatings and a bulk optic, as discussed above. In certain embodiments, a bonding material 485, comprising fritted glass, is deposited on at least one surface of the etalons 485 (see FIG. 12b). A portion of bonding material 485 may be etched away to form fritted glass feet 490 (see FIG. 12c). In other embodiments, the fritted glass feet 490 are deposited directly onto the surfaces of the etalons 480. Preferably the fritted glass is deposited using vapor deposition, sputter deposition, or other deposition processes known in the art. The feet of the etalons may be placed in contact with each other prior to heating or softening. The etalons are joined after the feet melt or soften and re-solidify (see FIG. 12d). After joining the etalons, the space 495 between the surfaces of the etalons is preferably equal to an odd number of QWOTs. The space 495 between adjacent coupled etalons may be filled with air or other suitable materials, depending on the intended use of the stacked, optically coupled etalons. One skilled in the art, given the benefit of this disclosure, will recognize that functionally different etalons, e.g. optically mismatched etalons, may be coupled using the method immediately described above to create stacked, optically coupled and optically mismatched etalons.

In accordance with additional preferred embodiments, a method for production of stacked, optically coupled etalons, suitable for optical mismatching, is shown in FIGS. 13a–13b. In this embodiment, the stacked, optically coupled etalons are in optical contact. A first etalon 500, a second etalon 505, and a third etalon 510 each comprise the components of the etalon shown and described in FIG. 5 including thin film coatings 502 on both surfaces of a bulk optic 504 (see FIG. 13a). The bulk optic may also comprise a thickness adjustment layer (not shown) and a wedge coating (not shown) underlying the thin film coatings. A first coupling member 515 and a second coupling member 520 maintain optical contact between the first, second, and third etalons (see FIG. 13b). The space 525 between adjacent etalons may be filled with air or other substances depending on the intended application of the stacked, optically coupled etalons. The thickness of the space between adjacent etalons is preferably equal to an odd number of QWOTs. One skilled in the art will recognize, given the benefit of this disclosure, that additional etalons may be coupled to the third etalon using the coupling members 515 and 520 and the method just described. One skilled in the art, given the benefit of this disclosure, will also recognize that functionally different etalons, e.g. optically mismatched etalons, may be coupled using the method immediately described above to create stacked, optically coupled and optically mismatched etalons.

In accordance with additional preferred embodiments, a method for production of stacked, optically coupled etalons, suitable for optical mismatching, is shown in FIGS. 14a–14b. In this embodiment, the stacked, optically coupled etalons are in optical contact. A first etalon 600, a second etalon 605, and a third etalon 610 each comprise the components of the etalon shown and described in FIG. 5 including thin film coatings 602 on both surfaces of a bulk optic 604 (see FIG. 14a). The bulk optic may also comprise a thickness adjustment layer (not shown) and a wedge coating (not shown) underlying the thin films. A first coupling member 615 and a second coupling member 620 maintain optical contact between the first, second and third etalons (see FIG. 14b). In this embodiment, there is no space between adjacent etalon surfaces after the etalons are joined. The thickness of the thin films may be altered to provide for the correct film thickness after the etalons are joined together. For example, if the thin film comprises a high refractive index oxide layer, a low refractive index oxide layer, followed by a high refractive index oxide layer (H/L/H), then to insure the thin film layers have the correct thickness after the etalons are joined, the thickness of the outermost (furthest from the surface of the bulk optic) high refractive index oxide layer may be reduced. That is, for example, the thickness of the outermost high refractive index oxide layer 602 of etalons 610 (see arrow A in FIG. 12a) and 605 (see arrow B in FIG. 12a), that will be in surface-to-surface contact may be reduced, e.g. by half, so that after joining adjacent etalons a thickness equal to an integral number of half waves is obtained, e.g. after joining adjacent etalons the thickness of each oxide layer preferably is equal to an integral number of half waves and the thickness of each oxide layer is approximately the same. One skilled in the art will recognize, given the benefit of this disclosure, that additional etalons may be coupled to the third etalon using the coupling members 615 and 620 and the method just described. One skilled in the art, given the benefit of this disclosure, will also recognize that functionally different etalons, e.g. optically mismatched etalons, may be coupled using the method immediately described above to create stacked, optically coupled and optically mismatched etalons.

Figure 15B:
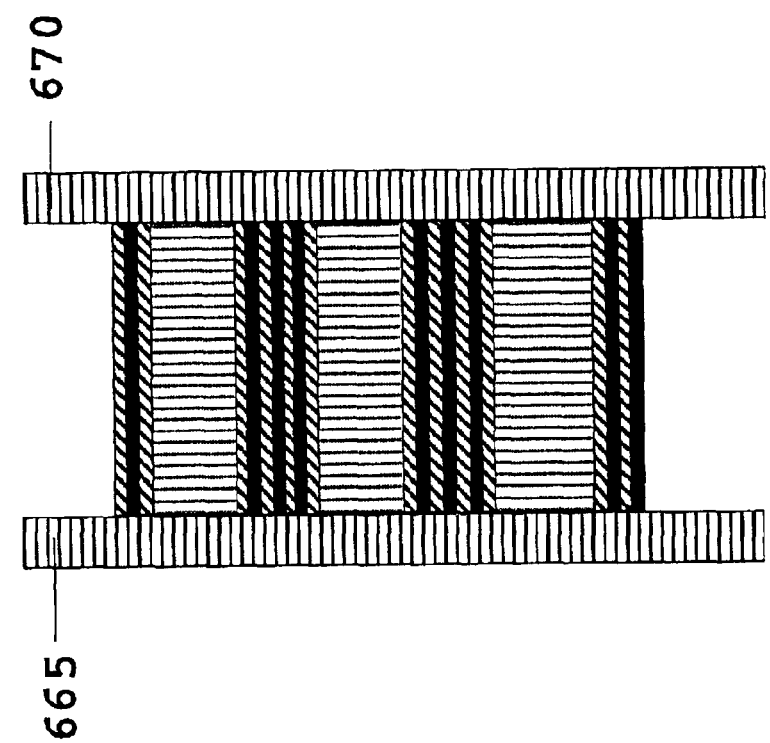
FIGS. 15a–15b is a sequential representation of a third embodiment of a method for optically coupling etalons using a coupling member.
Figure 15A:
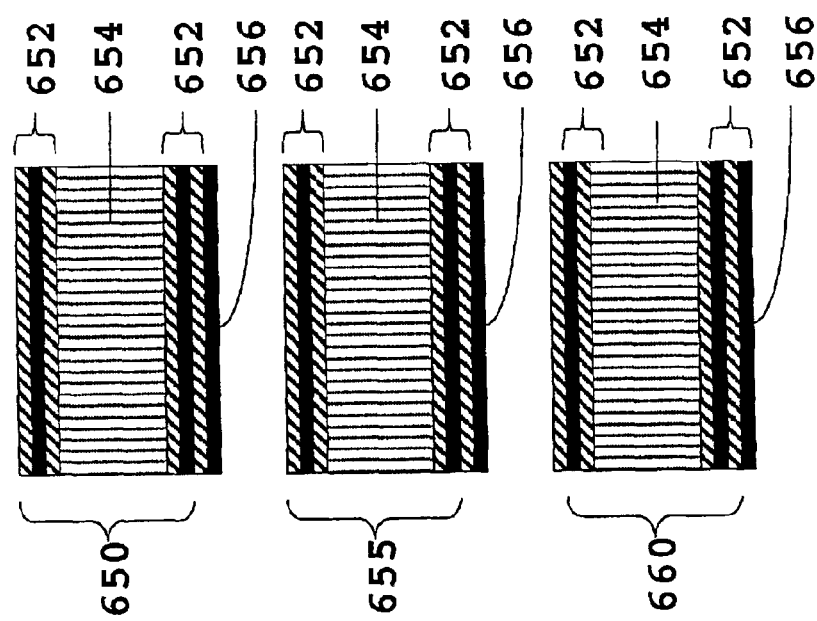

In accordance with additional preferred embodiments, a method for production of stacked, optically coupled etalons, suitable for optical mismatching, is shown in FIGS. 15a–15b. In this embodiment, the stacked, optically coupled etalons are in optical contact. A first etalon 650, a second etalon 655, and a third etalon 660 each comprise the components of the etalon shown and described in FIG. 5 including thin film coatings 652 on both surfaces of a bulk optic 654 (see FIG. 15a). The bulk optic may also comprise a thickness adjustment layer (not shown) and a wedge coating (not shown) underlying the thin films. A first coupling member 665 and a second coupling member 670 maintain optical contact between the first, second, and third etalons (see FIG. 15b). In this embodiment, there is no space between adjacent etalon surfaces. The order of layers of the thin films may be altered to provide for alternating high and low refractive oxide layers after the etalons are coupled. For example, if the thin film comprises a high refractive index oxide layer, a low refractive index oxide layer, followed by a high refractive index oxide layer (H/L/H), then to insure that alternating layers exist in the stacked, optically coupled etalons, an additional low refractive index oxide layer 656 may be deposited onto one or more of the etalons (see FIG. 15a). In this example, after joining the etalons the order of the oxide layers between the two bulk optics would be H/L/H/L/H/L/H, where each oxide layer has approximately the same thickness, e.g. an integral number of half waves. One skilled in the art will recognize, given the benefit of this disclosure, that additional etalons may be coupled to the third etalon using the coupling members 665 and 670 and the method just described. One skilled in the art, given the benefit of this disclosure, will also recognize that functionally different etalons, e.g. optically mismatched etalons, may be coupled using the method immediately described above to create stacked, optically coupled and optically mismatched etalons.

Figure 16B:
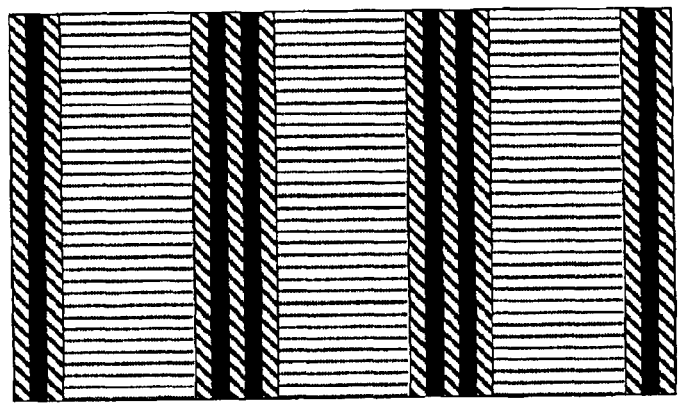
FIGS. 16a–16b is a sequential representation of a first embodiment of a method for optically coupling etalons without using a coupling member.
Figure 16A:
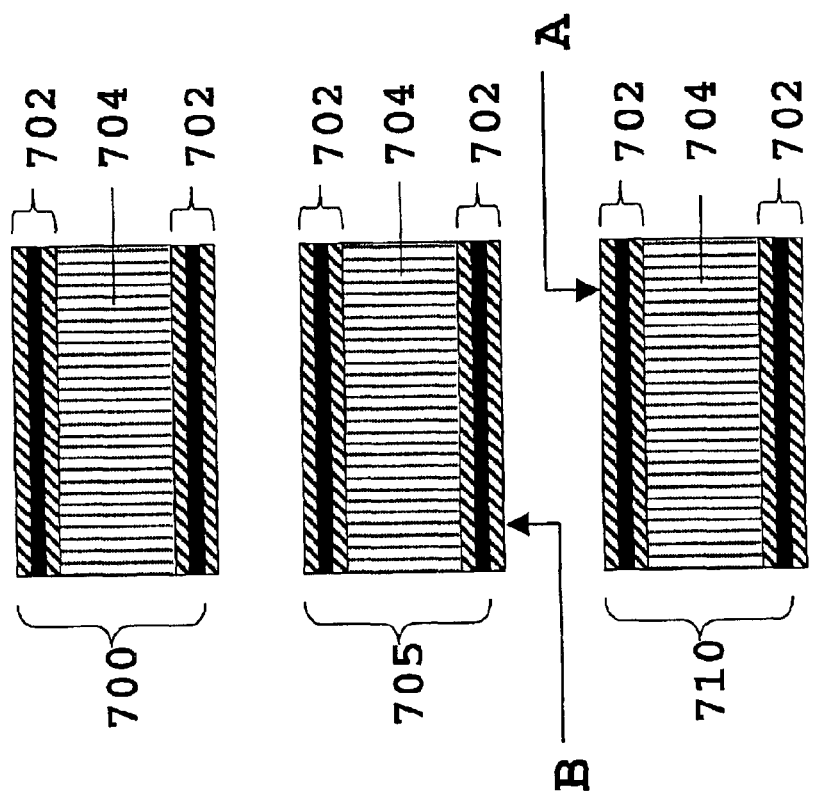

In accordance with additional preferred embodiments, a method for production of stacked, optically coupled etalons, suitable for optical mismatching, is shown in FIGS. 16a–16b. In this embodiment, the stacked, optically coupled etalons are in optical contact. A first etalon 700, a second etalon 705, and a third etalon 710 each comprise the components of the etalon shown and described in FIG. 5 including thin film coatings 702 on both surfaces of a bulk optic 704 (see FIG. 16a). The bulk optic may also comprise a thickness adjustment layer (not shown) and a wedge coating (not shown) underlying the thin films. In this embodiment, after joining of the etalons, there is no space between the etalon surfaces and a coupling member is not used (see FIG. 16b). Without wishing to be bound by theory, the etalons are held together by electrostatic forces between the surfaces of the thin film coatings. The thickness of the thin films may be altered to provide for the correct thickness after the etalons are coupled. For example, if the thin film comprises a high refractive index oxide layer, a low refractive index oxide layer, followed by a high refractive index oxide layer (H/L/H), then to insure the layers have the correct thickness after the etalons are joined, the thickness of the outermost (furthest from the surface of the bulk optic) high refractive index oxide layer may be reduced. That is, for example, the thickness of the outermost high refractive index oxide layer 702 of etalons 710 (see arrow A in FIG. 14a) and 705 (see arrow B in FIG. 14a), that will be in surface-to-surface contact may be reduced, e.g. by half, so that after joining adjacent etalons a thickness equal to an integral number of half waves is obtained, e.g. after joining adjacent etalons the thickness of each oxide layer preferably is equal to an integral number of half waves and the thickness of each oxide layer is approximately the same. In this example, after joining the etalons the order of the oxide layers between bulk optic bodies would then be H/L/H/L/H, where each oxide layer has approximately the same thickness, e.g. an integral number of half waves. One skilled in the art will recognize, given the benefit of this disclosure, that additional etalons may be coupled to the third etalon using the method just described. One skilled in the art, given the benefit of this disclosure, will also recognize that functionally different etalons, e.g. optically mismatched etalons, may be coupled using the method immediately described above to create stacked, optically coupled and optically mismatched etalons.

Figure 17B:
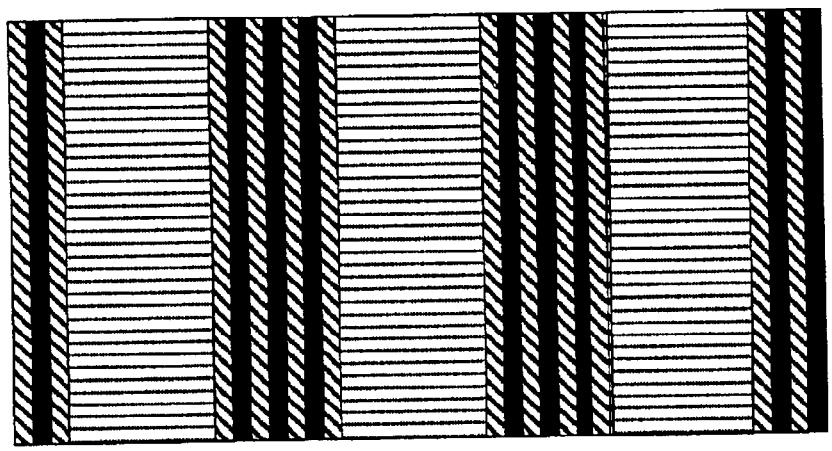
FIGS. 17a–17b is a sequential representation of a second embodiment of a method for optically coupling etalons without using a coupling member.
Figure 17A:
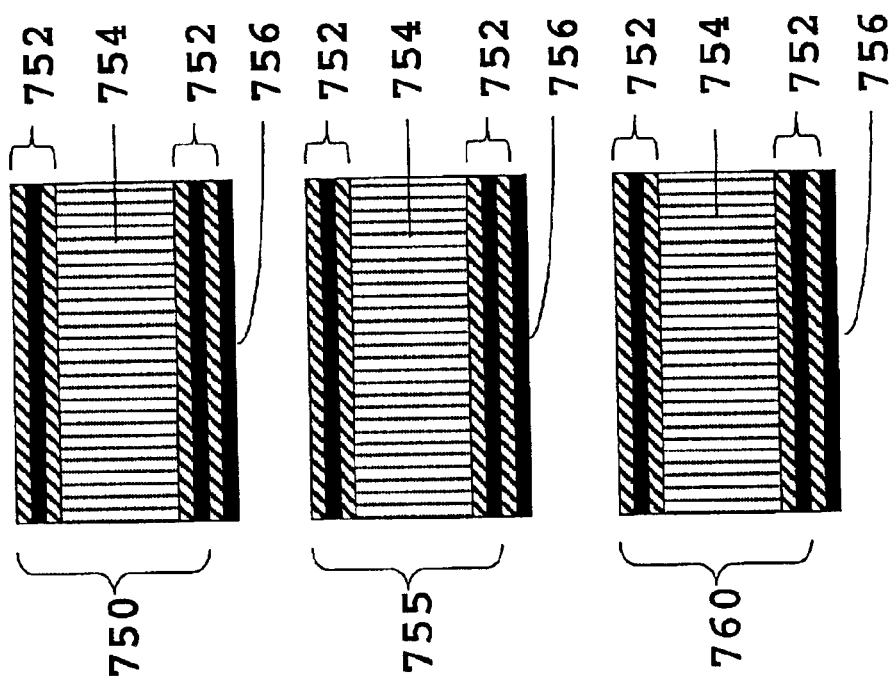

In accordance with additional preferred embodiments, a method for production of stacked, optically coupled etalons, suitable for optical mismatching, is shown in FIGS. 17a–17b. In this embodiment, the stacked, optically coupled etalons are in optical contact. A first etalon 750, a second etalon 755, and a third etalon 760 each comprise the components of the etalon shown and described in FIG. 5 including thin film coatings 752 on both surfaces of a bulk optic 754 (see FIG. 17a). The bulk optic may also comprise a thickness adjustment layer (not shown) and a wedge coating (not shown) underlying the thin film. In this embodiment, after joining the etalons, there is no space between the etalon surfaces and a coupling member is not used (see FIG. 17b). Without wishing to be bound by theory, the etalons are held together by electrostatic forces between the surfaces of the thin film coatings. The order of the oxide layers of the thin film may be altered to provide for an alternating high and low refractive oxide layers after the etalons are coupled. For example, if the thin film comprises a high refractive index oxide layer, a low refractive index oxide layer, followed by a high refractive index oxide layer (H/L/H), then to insure that alternating layers exist in the coupled etalons, an additional low refractive index oxide layer 756 may be deposited onto one of the etalons (see FIG.

15a). In this example, after joining the etalons the order of the oxide layers between the bulk optic would then be H/L/H/L/H/L/H, where each layer has approximately the same thickness. One skilled in the art will recognize, given the benefit of this disclosure, that additional etalons may be coupled to the third etalon using the method just described. One skilled in the art, given the benefit of this disclosure, will also recognize that functionally different etalons, e.g. optically mismatched etalons, may be coupled using the method immediately described above to create stacked, optically coupled and optically mismatched etalons.

Figure 18B:
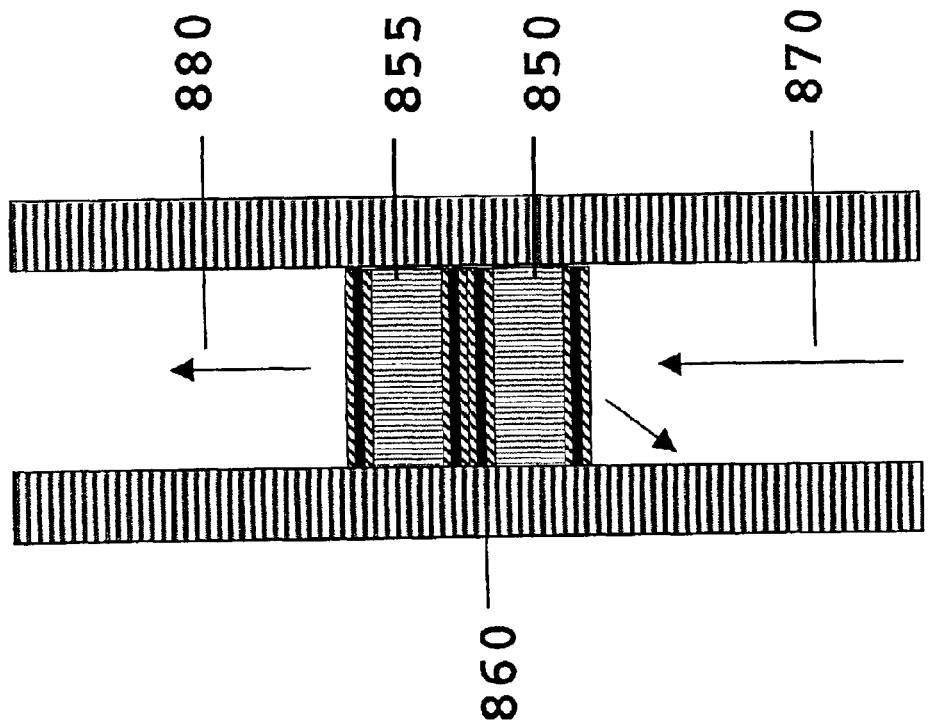
FIGS. 18a and 18b are embodiments of optically mismatched etalons.
Figure 18A:
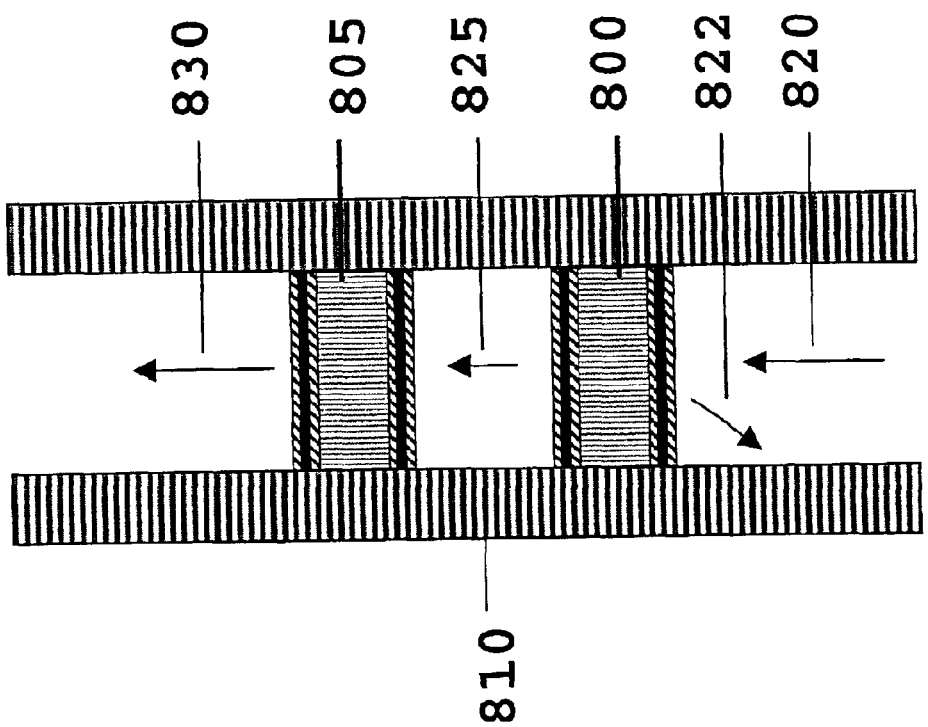

In accordance with preferred embodiments, FIGS. 18a and 18b show two of many possible configurations for optically mismatched etalons that are directly optically coupled. A first etalon 800 and a second etalon 805 are housed within an optical system 810. The first and second etalons are chosen so that the passband shape for the first and second etalons are different (e.g. see FIGS. 1a and 1b). For example, the passband shape of the first etalon can be similar to that of FIG. 1a, whereas the passband shape of the second etalon can be similar to that of FIG. 1b. In preferred embodiments, when placed into the optical system the longitudinal axis of the thin film coatings of the etalons are perpendicular to the direction of the optical path. As multiplexed signals 820 are incident on surface of the first etalon 800, the first etalon 800 selectively passes certain passbands 825 of the multiplexed signal 820. The multiplexed light may be launched from a first port, e.g. an optical fiber or a port in the optical fiber. Other signals 822 may be reflected by the first etalon and enter into a second port (not shown), for example. Certain passbands 825 passed by the first etalon are incident on the surface of a second etalon 805, which is separated from first etalon 800 by air space. Preferably, the resulting passband 830 that exits second etalon 805 comprises only a single passband. The signal 830 that exits the second etalon may be sent to an additional port (not shown) for detection, decoding, etc. Therefore, the optically mismatched etalons can act as a filter to selectively pass only a single passband. One skilled in the art, given the benefit of this disclosure, will be able to place additional etalons, preferably a plurality of etalons, into optical systems and optical sensors. Referring to FIG. 18b, optically mismatched etalons are placed in optical contact. A first etalon 850 and a second etalon 855 are placed into optical contact in an optical system 860. The optically mismatched etalons in optical contact perform similarly to the embodiment described here for mismatched etalons that are separated by air space. That is, the mismatched etalons in optical contact act to select a single passband 880 from multiplexed signals 870. In alternative embodiments, the optically mismatched etalons may be joined using the bonding materials and methods described above.

Figure 19B:
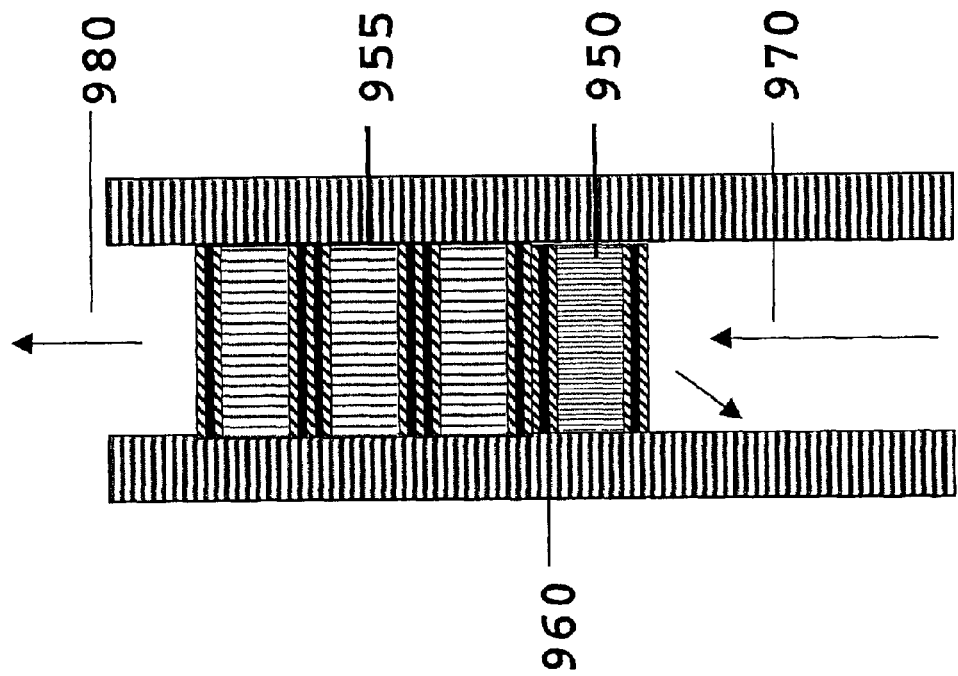
FIGS. 19a and 19b are embodiments of optically mismatched etalons and stacked, optically coupled etalons.
Figure 19A:
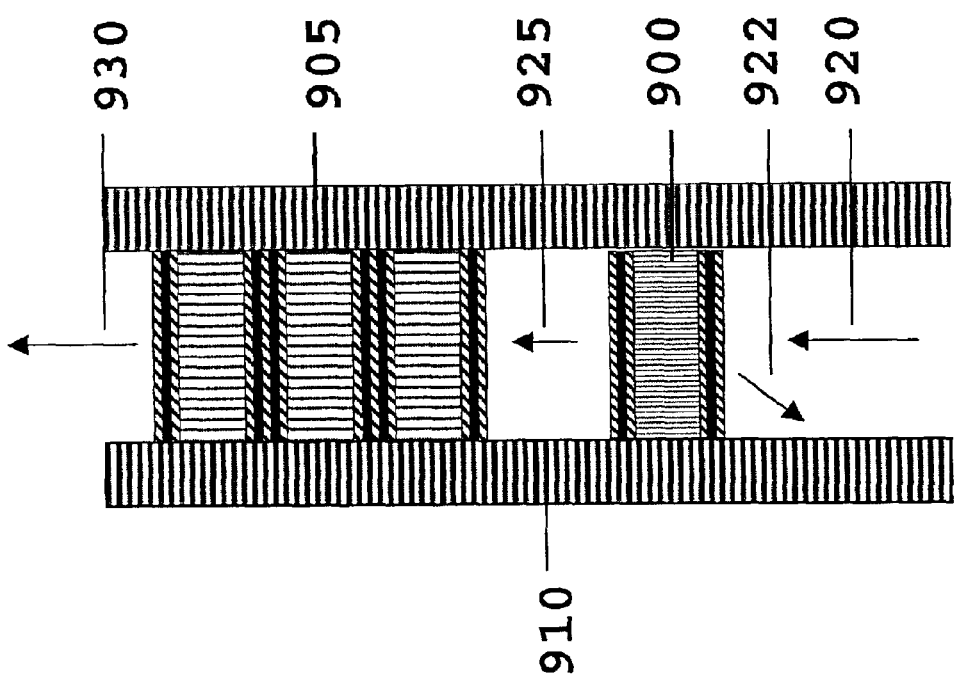

In accordance with preferred embodiments, FIGS. 19a and 19b show two of many possible configurations for optically mismatching an etalon and stacked, optically coupled etalons that are directly optically coupled. In this embodiment the etalon and stacked, optically coupled etalons are separated by air space. Referring to FIG. 19a, an etalon 900 and stacked, optically coupled etalons 905 a re housed within an optical system 910. The etalon and stacked, optically coupled etalons are chosen so that the passband shape for the etalon and the stacked, optically coupled etalons are different (e.g. see FIGS. 1a and 1b). For example, the passband shape of the etalon can be similar to that of FIG. 1a, whereas the passband shape of the stacked, optically coupled etalons can be similar to that of FIG. 1b. In preferred embodiments, when placed into the optical system the longitudinal axis of the thin film coatings of the etalon and stacked, optically coupled etalons are perpendicular to the direction of the optical path. As multiplexed signals 920 are incident on etalon 900, the etalon 900 selectively passes certain passbands 925. The multiplexed light may be launched from a first port, e.g. an optical fiber or a port in the optical fiber. Other signals 922 may be reflected by the first etalon and enter into a second port (not shown), for example. Certain passbands 925 passed by the etalon are incident on the stacked, optically coupled etalons 905. Preferably, the resulting light 930 that exits the stacked, optically coupled etalons 905 comprises only a single passband. The single passband may enter an additional port (not shown) for detection, decoding, etc. Therefore, the optically mismatched etalon and stacked, optically coupled etalons can act as a filter to selectively pass only a single passband. One skilled in the art, given the benefit of this disclosure, will be able to place additional etalons and stacked, optically coupled etalons, preferably a plurality of etalons and stacked, optically coupled etalons, into optical systems and optical sensors. Referring to FIG. 19b, an optically mismatched etalon and stacked, optically coupled etalons are placed into optical contact. The etalon 950 and stacked, optically coupled etalons 955 are placed into optical contact and housed in an optical system 960. The optically mismatched etalon and stacked, optically coupled etalons, in optical contact, can perform similarly to the embodiment described here for optically mismatched etalons and stacked, optically coupled etalons that are separated by air space. That is, the mismatched etalons and stacked, optically coupled etalons, in optical contact, can act to select a single passband 980 from multiplexed signals 970. In alternative embodiments, the optically mismatched etalon and stacked, optically coupled etalons may be joined using the bonding materials and methods described above.

In accordance with preferred embodiments, FIGS. 20a and 20b show two of many possible configurations for multiple optically mismatched stacked, optically coupled etalons that are directly optically coupled. Referring to FIG. 20a, first stacked, optically coupled etalons 1000 and second stacked, optically coupled etalons 1005 are housed within an optical system 1010 and separated by an air space. The first and second stacked, optically coupled etalons are chosen so that the passband shape for the first and second stacked, optically coupled etalons are different (e.g. see FIGS. 1a and 1b). For example, the passband shape of the first stacked, optically coupled etalons can be similar to that of FIG. 1a, whereas the passband shape of the second stacked, optically coupled etalons can be similar to that of FIG. 1b. In preferred embodiments, when placed into the optical system the longitudinal axis of the thin film coatings of the stacked, optically coupled etalons are perpendicular to the direction of the optical path. As multiplexed signals 1020 are incident on first stacked, optically coupled etalons 1000, the first stacked, optically coupled etalons 1000 selectively passes certain passbands 1025. The multiplexed light may be launched from a first port, e.g. an optical fiber or a port in the optical fiber. Other signals 1022 may be reflected by the first stacked, optically coupled etalons and enter into a second port (not shown), for example. Certain passbands 1025 are incident on the second stacked, optically coupled etalons 1005. Preferably, the resulting light 1030 that exits the second stacked, optically coupled etalons 1005 comprises only a single passband. The single passband may enter into an additional port (not shown) for detection, decoding, etc. Therefore, the optically mismatched stacked, optically coupled etalons can act as a filter to selectively pass only a single passband. One skilled in the art, given the benefit of this disclosure, will be able to place additional stacked, optically coupled etalons, preferably a plurality of stacked, optically coupled etalons, into optical elements and optical systems. Referring to FIG. 20b, optically mismatched stacked, optically coupled etalons are placed into optical contact. First stacked, optically coupled etalons 1050 and second stacked, optically coupled etalons 1055 are placed into optical contact and housed in an optical system 1060. The mismatched stacked etalons, in optical contact, can perform similarly to the embodiment described here for optically mismatched stacked, optically coupled etalons that are separated by air space. That is, the mismatched stacked, optically coupled etalons, in optical contact, can act to select a single passband 1080 from multiplexed light 1070. In alternative embodiments, the optically mismatched stacked, optically coupled etalons may be joined using the bonding materials and methods described above.

Figure 21:
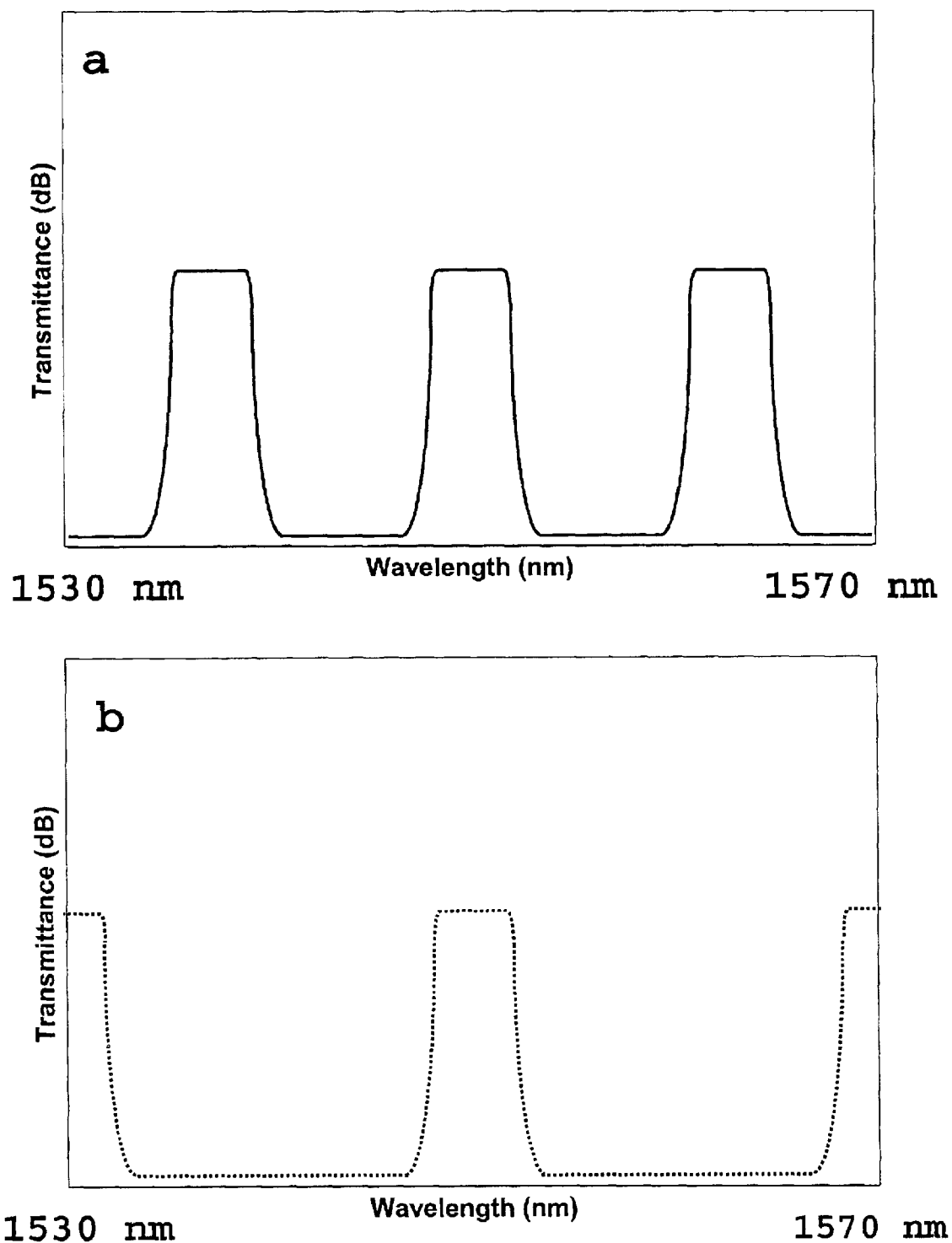
FIGS. 21a and 21b show the passband characteristics of first and second etalons.

FIGS. 21a and 21b show the passband characteristics of a first and second etalon, respectively, of an optical filter element, similar to that described above in connection with FIGS. 1a and 1b. It can be seen that the etalons of the optical filter element of FIGS. 21a and 21b are mismatched in accordance with the technology disclosed here. That is, the two etalons have a single passband in common within the operating wavelength range of the system in which the optical filter element is to be used. It will be understood by those skilled in the art that reference in this disclosure to the operating wavelength range of a system is the wavelength range within which a system is intended or designed to operate. Each of the two etalons can be seen to have multiple passbands within the operating wavelength range but only a single passband in common. In the preferred embodiment shown, the passbands are approximately equal size (i.e. having the same or approximately the same full-width at half-maximum height (FWHM) and preferably the same or approximately the same center wavelength). While the optical filter elements have passbands of approximately equal size, they are mismatched in that they have a different passband period, such that they have only a single passband in common within the operating wavelength range.

In accordance with preferred embodiments, the optically mismatched etalons and stacked, optically coupled etalons can be incorporated into an optical system operating in a wavelength band divided into multiple channels 1–n, each channel having a unique passband with a center wavelength spaced d nm from the center wavelength of adjacent channels within the band. In preferred embodiments, the width of each passband is preferably less than d nm. In accordance with the disclosure here, an optical filter element may comprise two or more optically mismatched etalons that are directly optically coupled, two or more optically mismatched and stacked, optically coupled etalons that are directly optically coupled, and/or an etalon that is optically mismatched and directly optically coupled with stacked, optically coupled etalons, etc. Other combinations, configurations, and orientations will be apparent to those skilled in the art, given the benefit of this disclosure. The optical filter element acts functionally to pass a single passband, e.g. an output signal, and reflects all other passbands, a reflected output signal. That is, the optical filter element can select a single channel from the multiple channels 1–n. Light can be launched on a first surface of the optical filter element from a port or the like. Passbands that are reflected by the first surface of the optical filter element may be collected by a port, a receiver, or the like. The single passband which is passed by the optical filter element can be collected at a port, receiver, or the like. The reflected output signal may be incident on additional optical filter elements to select one of the remaining passbands. One skilled in the art, given the benefit of this disclosure will be able to assemble optical systems comprising the optical filter element disclosed here to select a single channel from a wavelength band divided into multiple channels. Use of a plurality of optical filter elements can provide for de-multiplexing of the multiplexed signal In accordance with certain preferred embodiments, optical filter elements are provided comprising optically mismatched optical components, including but not limited to etalons and stacked, optically coupled etalons as disclosed above. Such optical filter elements may further comprise other optical components, including but not limited to filters, mirrors, lenses, prisms, gratings, etc., optically coupled to the optically mismatched optical components. Also, such optical filter elements may comprise a temperature compensator joined to the optically mismatched optical components. Suitable temperature compensators are known to those skilled in the art, including for example the temperature compensators disclosed in U.S. Pat. No. 5,982,488 to Shirasaki and in United States Patent application Banner & Witcoff, LTD titled "Iso-Optical Thermal Compensator and Methods of Making and Using Same," the entire disclosures of which are incorporated herein by reference. In accordance with preferred embodiments, optical communication systems are provided comprising optically mismatched optical components that are directly optically coupled, such as the etalons and the stacked, optically coupled etalons disclosed above. It will be within the ability of those skilled in the art, given the benefit of this disclosure, to produce the etalons and stacked, optically coupled etalons disclosed here, suitable for use in optical communication systems comprising optically mismatched optical components.

In accordance with preferred embodiments, optical sensors are provided comprising optically mismatched optical components that are directly optically coupled, such as the etalons and stacked, optically coupled etalons disclosed above. It will be within the ability of those skilled in the art, given the benefit of this disclosure, to produce the etalons and stacked, optically coupled etalons disclosed here, suitable for use in optical sensors comprising optically mismatched optical components.

Although the present invention has been described above in terms of specific embodiments, it is anticipated that other uses, alterations and modifications thereof will become apparent to those skilled in the art given the benefit of this disclosure. It is intended that the following claims be read as covering such alterations and modifications as fall within the true spirit and scope of the invention.

What is claimed is:

1. An optical filter element for filtering multiplexed light, comprising multiple directly optically coupled etalons, at least a first and a second of the etalons having optically mismatched periodic passbands, wherein
   at least one of the etalons comprises first and second selectively transparent thin film mirror coatings on opposite surfaces of a cavity formed by a bulk optic comprising a solid, optically transparent body, the bulk optic defining the cavity spacing of the etalon, and the first and second thin film coatings each comprising a film stack of alternating dielectric layers of higher and lower optical index of refraction,
   a thickness adjustment layer, and
   a wedge coating underlying the thin film coatings.

2. An optical filter element for filtering multiplexed light, comprising multiple directly optically coupled etalons and stacked, optically coupled etalons, at least a first etalon and first stacked, optically coupled etalons having optically mismatched periodic passbands.

3. The optical filter element of claim 2, wherein the optically mismatched etalons and stacked, optically coupled etalons are joined using a bonding material.

4. The optical filter element of claim 2, wherein surfaces of the optically mismatched etalons and stacked, optically coupled etalons are separated by air space.

5. The optical filter element of claim 2, wherein at least one of the etalons comprises first and second selectively transparent thin film mirror coatings on opposite surfaces of a cavity formed by a bulk optic comprising a solid, optically transparent body, the bulk optic defining the cavity spacing of the etalon.

6. The optical filter element of claim 5, wherein the first and second thin film coatings each comprises a film stack of alternating dielectric layers of higher and lower optical index of refraction.

7. The optical filter element of claim 5, wherein the bulk optic further comprises a thickness adjustment layer and a wedge coating underlying the thin film coatings.

8. The optical filter element of claim 5, wherein opposite surfaces of the bulk optic are substantially parallel.

9. The optical filter element of claim 2, wherein at least one of the etalons of the stacked, optically coupled etalons comprises first and second selectively transparent thin film mirror coatings on opposite surfaces of a cavity formed by a bulk optic comprising a solid, optically transparent body, the bulk optic defining the cavity spacing of the etalon.

10. The optical filter element of claim 2, further comprising a temperature compensator joined to the optically mismatched etalons and stacked, optically coupled etalons.

11. An optical communication system comprising the optical filter element of claim 2.

12. An optical sensor comprising the optical filter element of claim 2.

13. An optical filter element for filtering multiplexed light, comprising multiple directly optically coupled and stacked, optically coupled etalons, at least first and second stacked, optically coupled etalons having optically mismatched periodic passbands.

14. The optical filter element of claim 13, wherein the optically mismatched stacked, optically coupled etalons are joined using a bonding material.

15. The optical filter element of claim 13, wherein surfaces of the optically mismatched stacked, optically coupled etalons are separated by air space.

16. The optical filter element of claim 13, wherein at least one of the etalons of the stacked, optically coupled etalons comprises first and second selectively transparent thin film mirror coatings on opposite surfaces of a cavity formed by a bulk optic comprising a solid, optically transparent body, the bulk optic defining the cavity spacing of the etalon.

17. The optical filter element of claim 16, wherein the first and second thin film coatings each comprises a film stack of alternating dielectric layers of higher and lower optical index of refraction.

18. The optical filter element of claim 16, wherein the bulk optic further comprises a thickness adjustment layer and a wedge coating underlying the thin film coatings.

19. The optical filter element of claim 16, wherein opposite surfaces of the bulk optic are substantially parallel.

20. The optical filter element of claim 16, wherein the cavity spacing of the first stacked, optically coupled etalons differs from the cavity spacing of the second stacked, optically coupled etalons.

21. The optical filter element of claim 13, further comprising a temperature compensator joined to the optically mismatched stacked, optically coupled etalons.

22. An optical communication system comprising the optical filter element of claim 13.

23. An optical sensor comprising the optical filter element of claim 13.

24. An optical system for operating in a wavelength band divided into multiple channels 1–n, each channel having a unique passband with a center wavelength spaced d nm from the center wavelength of adjacent channels within the band comprising:

an optical filter element for filtering multiplexed light, comprising multiple directly optically coupled etalons, at least a first and a second of the etalons having optically mismatched periodic passbands, a first port for launching multiplexed signals from a signals from a signal source to a first surface of the optical filter element;

a second port for receiving a first output reflected from the first surface of the optical filter element; and a third port for receiving a second output passed by the optical filter element, the second output signal being a single channel of the channels 1–n, wherein at least one of the etalons comprises first and second selectively transparent thin film mirror coatings on opposite surfaces of a cavity formed by a bulk optic comprising a solid, optically transparent body, the bulk optic defining the cavity spacing of the etalon, and wherein the bulk optic further comprises a thickness adjustment layer and a wedge coating underlying the thin film coatings.

25. The optical system of claim 24, wherein the optically mismatched etalons are joined using a bonding material.

26. The optical system of claim 24, wherein surfaces of optically mismatched etalons are separated by air space.

27. The optical system of claim 24, wherein the first and second thin film coatings each comprises a film stack of alternating dielectric layers of higher and lower optical index of refraction.

28. An optical communication system comprising the optical system of claim 27.

29. An optical sensor comprising the optical system of claim 27.

30. The optical system of claim 24, further comprising a temperature compensator joined to the optically mismatched etalons.

31. The optical system of claim 24, wherein opposite surfaces of the bulk optic are substantially parallel.

32. The optical system of claim 24, wherein the cavity spacing of the first etalon differs from the cavity spacing of the second etalon.

33. An optical system for operating in a wavelength band divided into multiple channels 1–n, each channel having a unique passband with a center wavelength spaced d nm from the center wavelength of adjacent channels within the band comprising:

an optical filter element for filtering multiplexed light, comprising multiple directly optically coupled etalons and stacked, optically coupled etalons, at least a first etalon and first stacked, optically coupled etalons having optically mismatched periodic passbands, a first port for launching multiplexed signals from a signals from a signal source to a first surface of the optical filter element;

a second port for receiving a first output reflected from the first surface of the optical filter element; and a third port for receiving a second output passed by the optical filter element, the second output signal being a single channel of the channels 1–n.

34. The optical system of claim 33, wherein the optically mismatched etalons and stacked, optically coupled etalons are joined using a bonding material.

35. The optical system of claim 33, wherein surfaces of the optically mismatched etalons and stacked, optically coupled etalons are separated by air space.

36. The optical system of claim 33, wherein at least one of the etalons comprises first and second selectively transparent thin film mirror coatings on opposite surfaces of a cavity formed by a bulk optic comprising a solid, optically transparent body, the bulk optic defining the cavity spacing of the etalon.

37. The optical system of claim 36, wherein the first and second thin film coatings each comprises a film stack of alternating dielectric layers of higher and lower optical index of refraction.

38. An optical communication system comprising the optical system of claim 37.

39. The optical system of claim 36, wherein opposite surfaces of the bulk optic are substantially parallel.

40. The optical system of claim 33, wherein at least one of the etalons of the stacked, optically coupled etalons comprises first and second selectively transparent thin film mirror coatings on opposite surfaces of a cavity formed by a bulk optic comprising a solid, optically transparent body, the bulk optic defining the cavity spacing of the etalon.

41. The optical system of claim 33, further comprising a temperature compensator joined to the optically mismatched etalons and stacked, optically coupled etalons.

42. The optical system of claim 33, wherein the bulk optic further comprises a thickness adjustment layer and a wedge coating underlying the thin film coatings.

43. An optical sensor comprising the optical system of claim 33.

44. An optical system for operating in a wavelength band divided into multiple channels 1–n, each channel having a unique passband with a center wavelength spaced d nm from the center wavelength of adjacent channels within the band comprising:

an optical filter element for filtering multiplexed light, comprising multiple directly optically coupled etalons and stacked, optically coupled etalons, at least first and second stacked, optically coupled etalons having optically mismatched periodic passbands, a first port for launching multiplexed signals from a signals from a signal source to a first surface of the optical filter element;

a second port for receiving a first output reflected from the first surface of the optical filter element; and a third port for receiving a second output passed by the optical filter element, the second output signal being a single channel of the channels 1–n.

45. The optical system of claim 44, wherein the optically mismatched stacked, optically coupled etalons are joined using a bonding material.

46. The optical system of claim 44, wherein at least one of the etalons of the stacked, optically coupled etalons comprises first and second selectively transparent thin film mirror coatings on opposite surfaces of a cavity formed by a bulk optic comprising a solid, optically transparent body, the bulk optic defining the cavity spacing of the etalon.

47. The optical system of claim 46, wherein the first and second thin film coatings each comprises a film stack of alternating dielectric layers of higher and lower optical index of reaction.

48. The optical system of claim 46, wherein the bulk optic further comprises a thickness adjustment layer and a wedge coating underlying the thin film coatings.

49. The optical system of claim 46, wherein opposite surfaces of the bulk optic are substantially parallel.

50. The optical system of claim 46, wherein the cavity spacing of the first stacked, optically coupled etalons differs from the cavity spacing of the second stacked, optically coupled etalons.

51. The optical system of claim 44, further comprising a temperature compensator joined to the optically mismatched stacked, optically coupled etalons.

52. An optical communication system comprising the optical system of claim 44.

53. An optical sensor comprising the optical system of claim 44.

54. A method of filtering multiplexed light comprising the steps of:

providing a source of multiplexed light divided into channels 1–n;

providing multiple directly optically coupled etalons, at least a first and a second of said etalons having optically mismatched periodic passbands;

placing the etalons in a same optical path; and selecting a single channel of light from channels 1–n, wherein at least one of the etalons comprises first and second selectively transparent thin film mirror coatings on opposite surfaces of a cavity formed by a bulk optic comprising a solid, optically transparent body, the bulk optic defining the cavity spacing of the etalon, and the bulk optic optionally comprise a wedge coating and thickness adjustment layer underlying the thin film coatings.

55. A method of filtering multiplexed light comprising the steps of:

providing a source of multiplexed light divided into channels 1–n;

providing multiple directly optically coupled etalons and stacked, optically coupled etalons, at least a first etalon and first stacked, optically coupled etalons having optically mismatched periodic passbands;

placing the etalons and stacked, optically coupled etalons in a same optical path; and selecting a single channel of light from channels 1–n.

56. The method of claim 55, wherein the etalon and stacked, optically coupled etalon are joined using a bonding material.

57. The method of claim 55, wherein surfaces of the etalon and stacked, optically coupled etalon are separated by air space.

58. The method of claim 55, wherein the etalon and stacked, optically coupled etalon are only transparent to one common channel of light.

59. The method of claim 55, wherein at least one of the etalons comprises first and second selectively transparent thin film mirror coatings on opposite surfaces of a cavity formed by a bulk optic comprising a solid, optically transparent body, the bulk optic defining the cavity spacing of the etalon.

60. The method of claim 55, wherein at least one of the etalons of the stacked, optically coupled etalons comprises first and second selectively transparent thin film mirror coatings on opposite surfaces of a cavity formed by a bulk optic comprising a solid, optically transparent body, the bulk optic defining the cavity spacing of the etalon.

61. The method of claim 59 or 60, wherein the first and second thin film coatings each comprises a film stack of alternating dielectric layers of higher and lower optical index of refraction.

62. The method of claim 59, wherein the bulk optic further comprises a wedge coating and a thickness adjustment layer underlying the thin film coatings.

63. The method of claim 59, wherein a longitudinal axis of the thin film coatings are perpendicular to the optical path.

64. The method of claim 55, wherein a temperature compensator is joined to the first etalon and first stacked, optically coupled etalons.

65. The method of claim 55, wherein a bandpass filter is optically coupled to the first etalon and first stacked, optically coupled etalons.

66. A method of filtering multiplexed light comprising the steps of:

providing a source of multiplexed light divided into channels 1–n;

providing multiple directly optically coupled and stacked, optically coupled etalons, at least first and second stacked, optically coupled etalons having optically mismatched periodic passbands;

placing the stacked, optically coupled etalons in a same optical path; and selecting a single channel of light from channels 1–n.

67. The method of claim 66 wherein the optically mismatched attacked, optically coupled etalons are joined using a bonding material.

68. The method of claim 66, wherein surfaces of the optically mismatched attacked, optically coupled etalons are separated by air space.

69. The method of claim 66, wherein at least one etalon of the stacked, optically coupled etalons comprises first and second selectively transparent thin film mirror coatings on opposite surfaces of a cavity formed by a bulk optic comprising a solid, optically transparent body, the bulk optic defining the cavity spacing of the etalon.

70. The method of claim 69, wherein the first and second thin film coatings each comprises a film stack of alternating dielectric layers of higher and lower optical index of refraction.

71. The method of claim 69, wherein the bulk optic optionally comprise a wedge coating and thickness adjustment layer underlying the thin film coatings.

72. The method of claim 66, wherein a temperature compensator is joined to the first and second optically mismatched stacked, optically coupled etalons.

73. The method of claim 66, wherein a bandpass filter is optically coupled to the optically mismatched stacked, optically coupled etalons.

74. The method of claim 66, wherein a longitudinal axis of the thin film coatings are perpendicular to the optical path.

75. A method of filtering multiplexed light comprising the steps of:

providing a source of multiplexed light divided into channels 1–n;

providing an optical filter element comprising multiple directly optically coupled etalons and stacked, optically coupled etalons, at least a first etalon and first stacked, optically coupled etalons having optically mismatched periodic passbands;

placing the etalons and stacked, optically coupled etalons in a same optical path;

launching the multiplexed light from a first port to a first surface of the optical filter element;

receiving a first output signal, reflected from the first surface of the optical filter element, at a second port;

receiving a second output signal, passed by the optical filter element, at a third port, the second output signal being a single channel of the channels 1–n.

76. A method of filtering multiplexed light comprising the steps of:

providing a source of multiplexed light divided into channels 1–n;

providing an optical filter element for filtering multiplexed light, comprising multiple directly optically coupled and stacked, optically coupled etalons, at least first and second stacked, optically coupled etalons having optically mismatched periodic passbands;

placing the stacked, optically coupled etalons in a same optical path;

launching the multiplexed light from a first port to a first surface of the optical filter element;

receiving a first output signal, reflected from the first surface of the optical filter element, at a second port;

receiving a second output signal, passed by the optical filter element, at a third port, the second output signs being a single channel of the channels 1–n.

* * * * *